(12) United States Patent
Jevtic et al.

(10) Patent No.: US 6,224,638 B1
(45) Date of Patent: May 1, 2001

(54) METHOD AND APPARATUS FOR SCHEDULING WAFER PROCESSING WITHIN A MULTIPLE CHAMBER SEMICONDUCTOR WAFER PROCESSING TOOL HAVING A MULTIPLE BLADE ROBOT

(75) Inventors: Dusan Jevtic, Santa Clara; Srilakshmi Venkatesh, Sunnyvale, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/502,391

(22) Filed: Feb. 10, 2000

Related U.S. Application Data

(63) Continuation of application No. 09/015,726, filed on Jan. 29, 1998, now Pat. No. 6,074,443, which is a continuation-in-part of application No. 08/735,370, filed on Oct. 21, 1996, now Pat. No. 5,928,389.

(51) Int. Cl.[7] ............................. H01L 21/00; H01L 21/64

(52) U.S. Cl. ............................................................ 29/25.01

(58) Field of Search ........................................... 29/25.01

(56) References Cited

U.S. PATENT DOCUMENTS

| | | | |
|---|---|---|---|
| 5,135,608 | * | 8/1992 | Okuani . |
| 5,375,061 | | 12/1994 | Hara et al. ........................... 364/468 |
| 5,402,350 | | 3/1995 | Kline ................................... 364/468 |

FOREIGN PATENT DOCUMENTS 2 296 818     7/1996   (GB) .

* cited by examiner

Primary Examiner—David E. Graybill
(74) Attorney, Agent, or Firm—Thomason, Moser & Patterson

(57) ABSTRACT

Apparatus and concomitant method for performing priority-based scheduling of wafer processing within a multiple chamber semiconductor wafer processing system (cluster tool) having a dual blade wafer transfer mechanism. The sequencer assigns priority values to the chambers in a cluster tool, then moves wafers from chamber to chamber in accordance with the assigned priorities. The sequencer is capable of determining the amount of time available before a priority move is to be performed and, if time is sufficient, the sequencer performs a non-priority move while waiting. The sequencer also dynamically varies assigned priorities depending upon the availability of chambers in the tool. Lastly, the sequencer prioritizes the chambers based upon the minimum time required for the wafer transfer mechanism to move the wafers in a particular stage.

22 Claims, 15 Drawing Sheets

METHOD AND APPARATUS FOR SCHEDULING WAFER PROCESSING WITHIN A MULTIPLE CHAMBER SEMICONDUCTOR WAFER PROCESSING TOOL HAVING A MULTIPLE BLADE ROBOT

CROSS REFERENCE TO A RELATED APPLICATION

This application is a continuation of Ser. No. 09/015,726 filed Jan. 19, 1998 now U.S. Pat. No. 6,074,443, which is a continuation-in-part of U.S. application Ser. No. 08/735,370, filed Oct. 21, 1996 now U.S. Pat. No. 5,928,389, entitled METHOD AND APPARATUS FOR PRIORITY BASED SCHEDULING OF WAFER PROCESSING WITHIN A MULTIPLE CHAMBER WAFER PROCESSING TOOL, which is herein incorporated by reference.

BACKGROUND OF THE DISCLOSURE

1. Field of the Invention

The present invention relates to a multiple chamber wafer processing system and, more particularly, to a method and apparatus for scheduling processing for semiconductor wafers within a multiple chamber semiconductor wafer processing tool having a multiple blade wafer transfer mechanism.

2. Description of the Prior Art

Semiconductor wafers are processed to produce integrated circuits using a plurality of sequential process steps. These steps are performed using a plurality of process chambers. An assemblage of process chambers served by a wafer transport robot is known as a multiple chamber semiconductor wafer processing tool or cluster tool.

FIG. 1 depicts a schematic diagram of an illustrative multiple chamber semiconductor wafer processing tool known as the Endura System manufactured by Applied Materials, Inc. of Santa Clara, Calif. Endura is a trademark of Applied Materials, Inc. of Santa Clara, Calif. This tool can be adapted to utilize either single, dual, or multiple blade robots to transfer wafers from chamber to chamber.

The cluster tool 100 contains, for example, four process chambers 104, 106, 108, 110, a transfer chamber 112, a preclean chamber 114, a buffer chamber 116, a wafer-orienter/degas chamber 118, a cooldown chamber 102, and a pair of load lock chambers 120 and 122. Each process chamber represents a different stage or phase of semiconductor wafer processing. The buffer chamber 116 is centrally located with respect to the load lock chambers 120 and 122, the wafer orienter/degas chamber 118, the preclean chamber 114 and the cooldown chamber 102. To effectuate wafer transfer amongst these chambers, the buffer chamber 116 contains a first robotic transfer mechanism 124, e.g., a single blade robot (SBR). The wafers 128 are typically carried from storage to the system in a plastic transport cassette 126 that is placed within one of the load lock chambers 120 or 122. The robotic transport mechanism 124 transports the wafers 128, one at a time, from the cassette 126 to any of the three chambers 118, 102, or 114. Typically, a given wafer is first placed in the wafer orienter/degas chamber 118, then moved to the preclean chamber 114. The cooldown chamber 102 is generally not used until after the wafer is processed within the process chambers 104, 106, 108, 110. Individual wafers are carried upon a wafer transport blade 130 that is located at the distal end of the first robotic mechanism 124. The transport operation is controlled by the sequencer 136.

The transfer chamber 112 is surrounded by, has access to, the four process chambers 104, 106, 108 and 110, as well as the preclean chamber 114 and the cooldown chamber 102. To effectuate transport of a wafer amongst the chambers, the transfer chamber 112 contains a second robotic transport mechanism 132, e.g., a dual blade robot (DBR). The mechanism 132 has a pair of wafer transport blades 134A and 134B attached to the distal ends of a pair of extendable arms. The blades are used for carrying the individual wafers. In operation, one of the wafer transport blades (e.g., blade 134A) of the second transport mechanism 132 retrieves a wafer from the preclean chamber 114 and carries that wafer to the first stage of processing, for example, a physical vapor deposition (PVD) stage within chamber 104. If the chamber is busy, the robot waits until the processing is complete and then swaps wafers, i.e., removes the processed wafer from the chamber with one blade (e.g., blade 134B) and inserts a new wafer with a second blade (e.g., blade 134A). Once the wafer is processed and PVD stage deposits material upon the wafer, the wafer can then be moved to a second stage of processing, and so on. For each move, the transport mechanism 132 generally has one blade carrying a wafer and one blade empty to execute a wafer swap. The transport mechanism waits at each chamber until a swap can be accomplished.

Once processing is complete within the process chambers, the transport mechanism 132 moves the wafer from the process chamber and transports the wafer to the cooldown chomper 102. The wafer is then removed from the cooldown chamber using the first transport mechanism 124 within the buffer chamber 116. Lastly, the wafer is placed in transport cassette 126 within the load lock chamber 122.

More generally, a cluster tool contains n chambers, denoted by $C_1, C_2, \ldots C_n$, one or more transfer chambers (robots), and one or more load locks. The exact arrangement of chambers is known as the configuration. A wafer $W_a$ to be processed is taken from a load lock, placed successively into various chambers $C_j$, e.g., $C_1, C_2, \ldots C_k$, respectively, and then returned to a load lock. As such, the wafers "trace" through the tool is represented by $$LL \to C_1 \to C_2 \to LL \quad (1)$$

where $W_a$ visits chambers $C_1$ and $C_2$. Denotation $C_j$ and $C_{j+1}$ means that a wafer has to visit chamber $C_{j+1}$ after visiting chamber $C_j$. Note that a wafer's trace does not have to involve all chambers in the configuration.

As defined in equation 1, a wafer's trace is the trajectory of a particular wafer through the cluster tool; that is, it traces the order in which the chambers are visited by a wafer. This should be distinguished from the term "processing sequence" which is the order of applying processes (recipes) to a wafer. If more than one chamber executes the same process (parallel chambers), a given processing sequence may be satisfied by several different traces. A processing sequence is known ahead of time and is a part of a computer program known as a sequencer which schedules the movement of wafers through the cluster tool; describes processes to be applied to the wafers while in the various chambers; describes processes a chamber is subjected to while in clean mode; describes conditions for the status change of a chamber (e.g., how many wafers or how much time before the clean process must be performed); and the like. An alternative term for a sequencer is a "router".

A wafer which completes its processing sequence and is returned to the load lock is said to be processed by the tool. Roughly speaking, a tool's throughput is the number of wafers processed by the tool per unit of time. That is, if the tool needs T seconds to process $N_t$ wafers, then $$\text{Throughput} = N_t/T \tag{2}$$

The tool's throughput measured in the interval [0,T]. There are many ways to improve the tool's throughput for a given processing sequence. However, one important improvement is the use of a dual blade robot in one or more of the transport mechanisms. Generally, the second blade is fixed at a position 180° opposite the first blade within a transport mechanism, e.g., as shown in FIG. 1. Alternatively, one blade may be positioned above the other blade and the two blades are either fixed with respect to one another (i.e., an over-under fixed (OUF) robot) or move independently with respect to one another (i.e., an over-under independent (OUI) robot). In any of those configurations, the scheduling processes used to fulfill a given process sequence differ from those scheduling processes used for a single blade transport mechanism.

Heretofore, a cluster tool processed wafers in the sequence they were received. This can lead to a less than optimal throughput.

Therefore, a need exists in the art for a scheduling routines that efficiently control a multiple blade robot within a cluster tool.

SUMMARY OF THE INVENTION

The disadvantages heretofore associated with the prior art are overcome by an invention of a method and apparatus for performing scheduling of wafer processing within a multiple chamber semiconductor wafer processing system (a cluster tool) having at least one multiple blade robot. The invention provides a method and apparatus for prioritizing wafer movement through the tool such that the tool's overall throughput is improved.

One embodiment of the invention begins with both blades of the robot empty and proceeds by selecting a wafer from the sequence step $S_0$ and then swapping this wafer with another wafer in a subsequent sequence step, and eventually stopping at sequence step $S_{n+1}$. The wafers at each process step are associated with a priority index and are moved through the tool in accordance with the priority index. During each of the intermediate steps, both blades of the transfer mechanism are full while the wafer is actually being swapped from one chamber to another. Also, a wafer may wait on the blade of a robot while waiting for another wafer in a subsequent process sequence step to complete its processing. This technique can accommodate a number of different types of chambers and wafer priorities. Examples of some of the different types of prioritization are: (1) oldest wafer; (2) required processing time; (3) wafer expense; (4) remaining processing time on a particular wafer; (5) order of wafer entry (i.e., first in-first out, or last in-first out) and the like.

In another embodiment of the invention, the sequencer pre-positions the robot into a position for swapping wafers. Consequently, the robot is moved to an appropriate chamber before the wafer is ready for retrieval. The selection of the chamber may be accomplished using the various prioritization indices specified above.

In another embodiment of the invention is a gamma(γ)-tolerant scheduling routine. Since each stage contains a process with a known time required to complete the process, the method computes how long any one chamber will be used to process a wafer. In the foregoing wafer scheduling techniques, if a high priority chamber was filled and processing a wafer, the robot may wait until that wafer is completed processing, then remove the processed wafer and replace it with a new wafer, i.e., "swap" wafers. To improve efficiency, rather than have the robot wait for completion of the process, the robot moves another wafer while awaiting the high priority wafer to be completed. The method decides which wafer to move, based on certain timing requirements.

Specifically, the γ-tolerant method computes a value that equals the rotation time for the robot to move to another position and return, plus the wait time anticipated at the other chamber. This value is referred to as $T_{meanwhile}$. In addition, the method uses a variable denoted $T_{remains}$ as the time remaining for the process in the high priority chamber to be complete. Dividing $T_{remains}$ by $T_{meanwhile}$ provides an indicia of whether or not the robot should proceed to the next chamber or await the present chamber's completion. The quotient value is compared to a threshold denoted γ. If the variable does not exceed the value of γ, the method will cause the robot to wait at the high priority chamber until the process is complete. Otherwise, the robot proceeds to the other chamber and moves that wafer. Consequently, the process throughput of this system is substantially improved over a conventional wafer packing technique.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

As discussed above, FIG. 1 depicts a schematic diagram of a conventional multiple chamber semiconductor wafer processing tool including a dual blade robot. The depicted cluster tool 100 is controlled by a sequencer 136 that executes the priority-based scheduling routines of the present invention.

Figure 1:
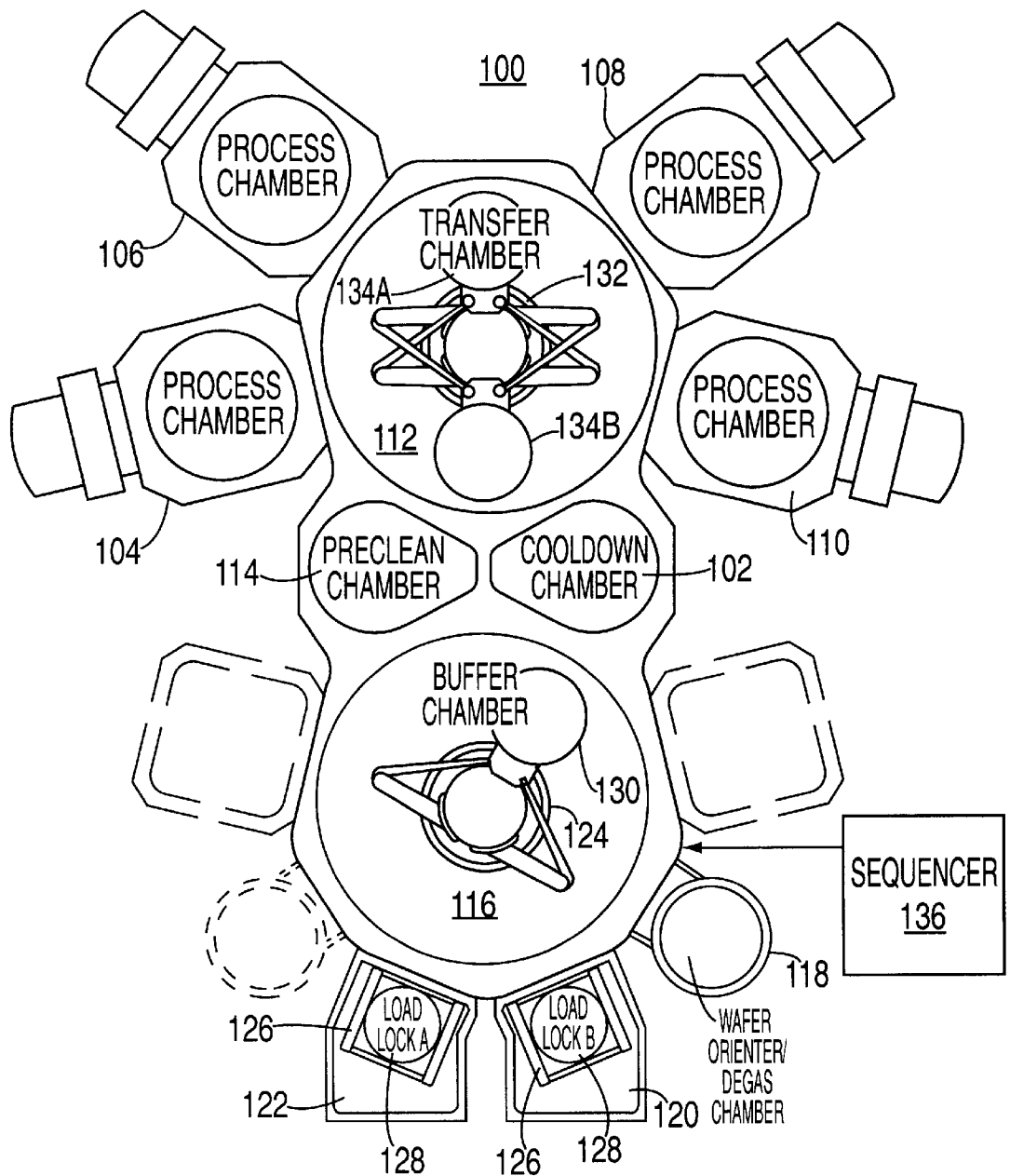
FIG. 1 depicts a schematic diagram of a multiple chamber semiconductor wafer processing tool having a dual blade wafer transport mechanism in one of two transport chambers, where both of the transport mechanisms are controlled by a sequencer.
Figure 2:
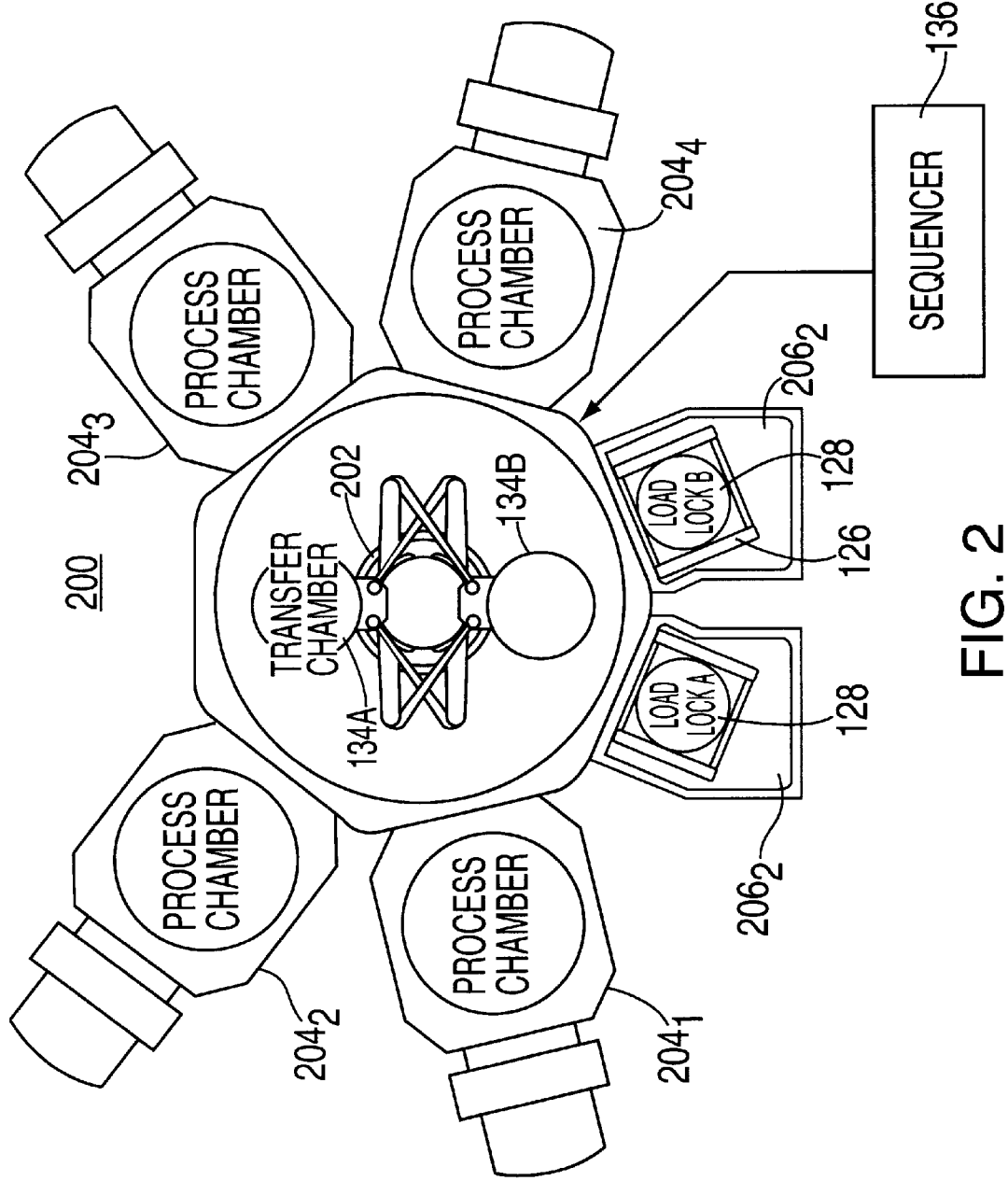
FIG. 2 depicts a schematic diagram of a multiple chamber semiconductor wafer processing tool having a dual blade wafer transport mechanism within a single transport chamber, where the transport mechanism is controlled by a sequencer.

The invention pertains to any type of a Dual Blade Robot (DBR) cluster tool and more generally to any robot having two or more extensible arms that may each have one ore more blades for carrying substrates. One form of cluster tool having a pair of "daisy-chained" transfer spaces, known as the Endura platform is depicted in FIG. 1. A second form of cluster tool 200, known as the Centura platform, manufactured by Applied Materials of Santa Clara, Calif. is schematically depicted in FIG. 2 as having a single, dual blade robot 202 within a single transfer space that services a plurality of process chambers $204_1$, $204_2$, $204_3$ and $204_4$ and a pair of load lock chambers $206_1$ and $206_2$. Endura and Centura are trademarks of Applied Materials, Inc. of Santa Clara, Calif.

Figure 14A:
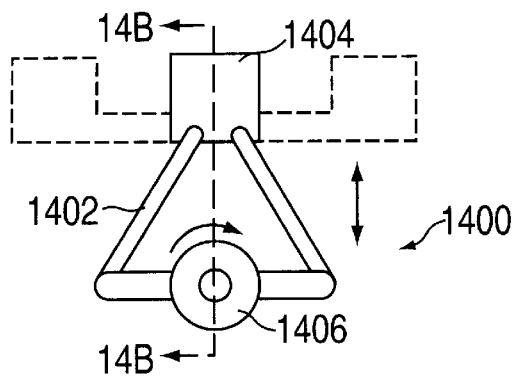
FIGS. 14A and 14B respectively depict a top plan view and a cross-sectional view of a robot having a single transport arm, e.g., an HP robot.
Figure 14B:
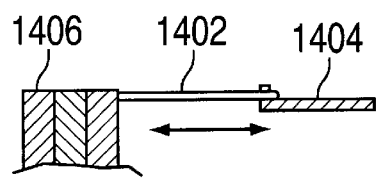

Each of these platforms may use a number of different types of robot configurations within the transfer spaces. For example, three types of robots are available. These are known as the HP, the VHP and the FHP robots. HP and VHP are trademarks of Applied Materials, Inc. of Santa Clara, Calif. The HP robot 1400, depicted as a top plan view in FIG. 14A and in a cross-sectional view in FIG. 14B, has a single transport arm 1402 that may include one or more blades 1404 located at the distal end thereof. Generally, one blade is provided on each arm; however, FIGS. 14, 15, and 16 depict the robots having more than one blade, e.g., three blades, in phantom. The HP robot 1400 may position one or more wafers in a chamber by extending and retracting the arm and pivoting about hub 1406.

Figure 15A:
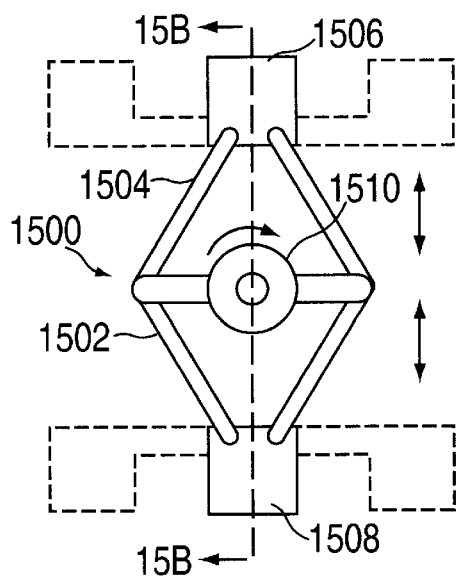
FIGS. 15A and 15B respectively depict a top plan view and a cross-sectional view of a robot having a pair of transport arms, e.g., an VHP robot.
Figure 15B:
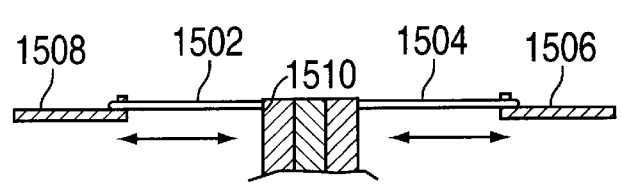

The VHP robot 1500, depicted in FIGS. 15A (top plan view) and 15B (cross-sectional view) has a pair of transport arms 1502 and 1504 that may include one or more blades 1506 and 1508 located at the distal end thereof. The arms are tightly coupled in that they are fixed at 180° relative to one another. As such, only one arm can be servicing one chamber at any given moment. The arms 1502 and 1504 pivot in unison about the hub 1510.

Figure 16A:
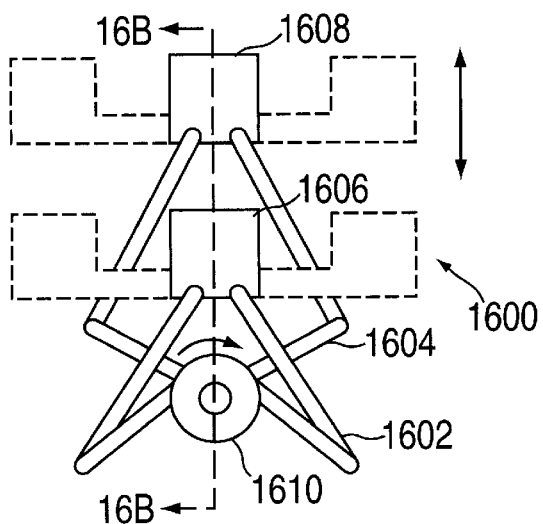
FIGS. 16A and 16B respectively depict a top plan view and a cross-sectional view of a robot having a pair of transport arms arranged in an over-under orientation, e.g., an FHP robot.
Figure 16B:
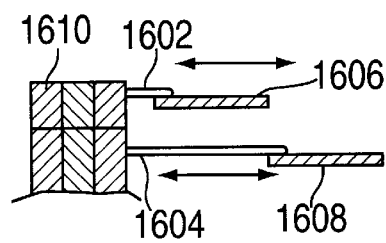

The FHP robot 1600, depicted in FIG. 16A (top plan view) and 16B (cross-sectional view), has a pair of arms 1602 and 1604 that may include one or more blades 1606 and 1608 located at the distal end thereof, but differs from the VHP robot 1500 in that the arms are aligned at 0° relative to one another, i.e., the arms are positioned one atop the other and separated from one another by a vertical distance z. As such, only one arm can be servicing one chamber at any given time. The FHP arms 1602 and 1604 are fixed relative to one another and, therefore, the arms rotate together about hub 1610 to service chambers. This form of robot is also known as an over-under fixed (OUF) robot.

An extension of the FHP robot is to decouple the arms such that each arm and its associated blade(s) rotate independently to form an over-under independent (OUI) robot. Consequently, an OUI robot performs as if two HP robots are simultaneously operating within the cluster tool.

To facilitate aligning a blade of the OU robot 1600 with the chamber access slit, either the OU robot itself or a chamber robot (i.e., the pins that support a wafer in the chamber) moves vertically. When the OU robot 1600 moves to facilitate alignment with the chamber, it generally shifts vertically upon its central hub 1610. When the chamber robot moves, it generally moves a set of wafer lift pin up or down to align the wafer with either the upper or lower robot blade.

The OUI robot can easily have its arms "fixed" relative to one another such that it can operate as an FHP or VHP robot. Also, an OUI robot may have a complex structure with a dual blade robot operating as either the upper or lower mechanism. As such, a VHP robot can be used as the lower mechanism and an HP robot used in the upper mechanism or vice versa.

Figure 17:
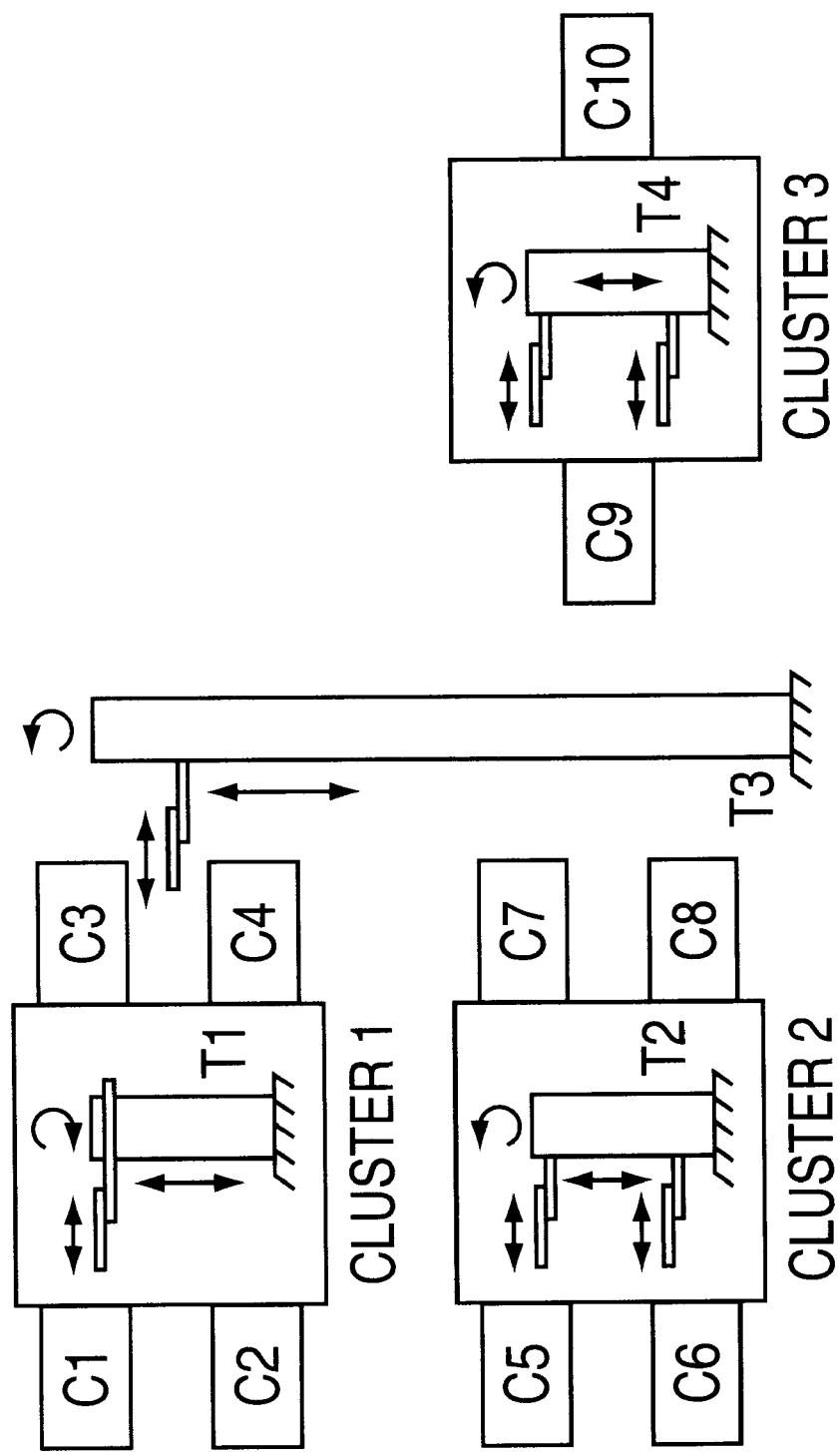
FIG. 17 depicts a simplified schematic diagram of a stacked cluster tool system that can be operated using priority-based scheduling.

Additionally, the foregoing discussion assumed one or two transfer spaces (buffer or transfer chambers); however, conceivably any number of such transfer spaces can be "daisy chained" to create a "daisy cluster". Furthermore, as depicted in FIG. 17, the transfer spaces may be aligned vertically (i.e., stacked in a z-direction) such that the chambers in clusters 1 and 2 and associated with a particular transfer space (T3) are stacked vertically and accessed by moving the robot along a z-axis as well as rotating the robot. Such transfer spaces could also be daisy-chained to allow transfer of wafers between transfer spaces. As such, a cluster can be envisioned as a cluster tool of cluster tools (sub-tools), where a multiple blade robot resides in a transfer space that services the sub-tools to transfer wafers therebetween. The process of transferring wafers between two adjoining transfer spaces may or may not require an additional robot. For example, in the case of Endura, transferring wafers between two adjoining clusters (i.e., the buffer and transfer spaces) is accomplished by passing the wafer through a chamber that can be accessed by both the buffer robot and the transfer robot.

The scheduling routines of the present invention are illustrated on VHP robot, FHP robot, and an Over-Under with Independent blades (OUI) robot. The routines are generally modular such that they apply to a single transfer space and thus can be easily utilized for daisy-chained and stacked, daisy-chained transfer spaces. Throughout this disclosure, unless otherwise noted, any reference to a "dual blade robot" or "DBR" is intended to encompass any robot having more than one extendable/retractable arm supporting at least one blade.

Figure 3:
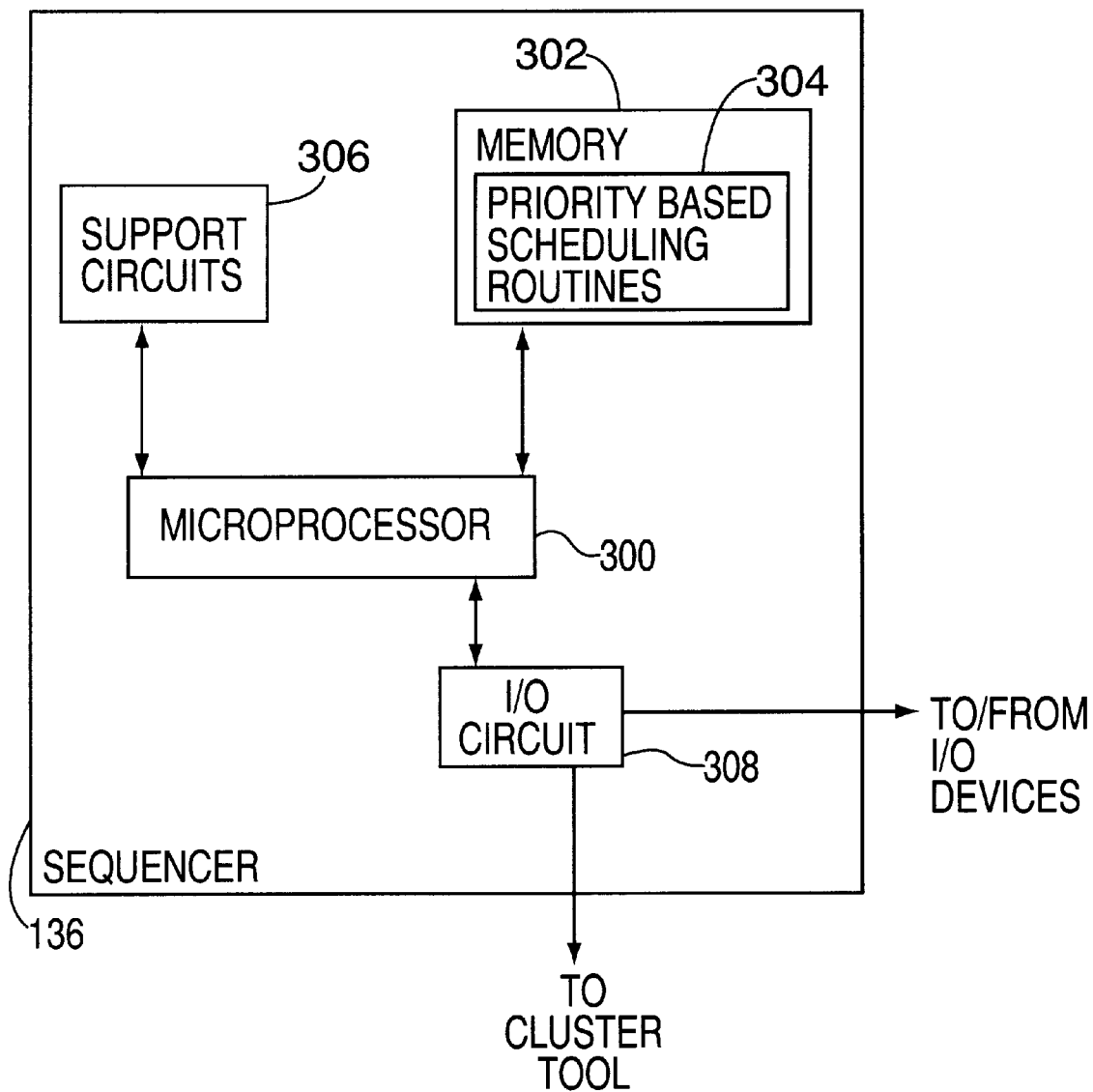
FIG. 3 depicts a block diagram of a sequencer that performs operative steps in accordance with the present invention.

FIG. 3 depicts a block diagram of a sequencer that operates to control the processing and wafer transfer performed by the cluster tool 100 of FIG. 1 or 200 of FIG. 2. The sequencer 136 contains a microprocessor 300, a memory 302 for storing the routines of the present invention, and support circuits 306, such as power supplies, clock circuits, cache and the like. The sequencer 136 also contains input/output circuitry 308 that forms an interface between conventional input/output (I/O) devices such as a keyboard, mouse, and display, as well as an interface to the cluster tool. The sequencer 136 is a general purpose computer that is programmed to perform the sequencing and scheduling operations in accordance with the present invention. The basic operation of the cluster tool, as well as the sequencer, is defined above. The software implementation 304 of the methods of the present invention are stored within memory 302 and executed by the microprocessor 300 to facilitate control of at least one dual blade robot wafer transport mechanism within the cluster tool.

It is contemplated that some of the process steps discussed herein as software processes may be implemented within hardware, e.g., as circuitry that cooperates with the microprocessor to perform various process steps. Although the schedule generator is depicted as a general purpose computer that is programmed to perform the scheduling routines in accordance with the present invention, the invention can be implemented as hardware as an application specific integrated circuit (ASIC). As such, the process steps described herein are intended to be broadly interpreted as being equivalently performed by software, hardware, or a combination thereof.

In general, a wafer W is processed through a series of sequence steps $S_i$, where i equals 0,1, ..., k, representing the process recipe and where k is the number of sequencing steps that are required before wafer W is completely processed by the cluster tool. Additionally, the beginning step (e.g., the load lock) is denoted $S_0$ and the final step (e.g., also a loadlock) as $S_{k+1}$. At each of the sequencing steps, wafer W may be processed by one of a number of parallel-oriented process chambers collectively denoted by $C_i$, e.g., chambers $C_{i1}$ and $C_{i2}$ may both perform the same process such that either one of the chambers can be used to fulfill a given sequence step $S_i$. The notation $T_i$ is used to denote the processing time required to process wafer W in any chamber $C_{ij}$ within the chamber group $C_i$ during the sequence step $S_i$. The variable j identifies the chambers within the group $C_i$ that can fulfill the sequence step $S_i$. Additionally, in the Endura system which has both buffer and transfer chambers containing robots, chambers A and B are designated as sequence steps $S_p$ and $S_q$ respectively, e.g., the points of entry and exit to the transfer chamber.

For example, consider the series:

$$LL \rightarrow (C_{11} \text{ or } C_{12}) \rightarrow (C_{21} \text{ or } C_{22}) \rightarrow LL$$

Figure 13:
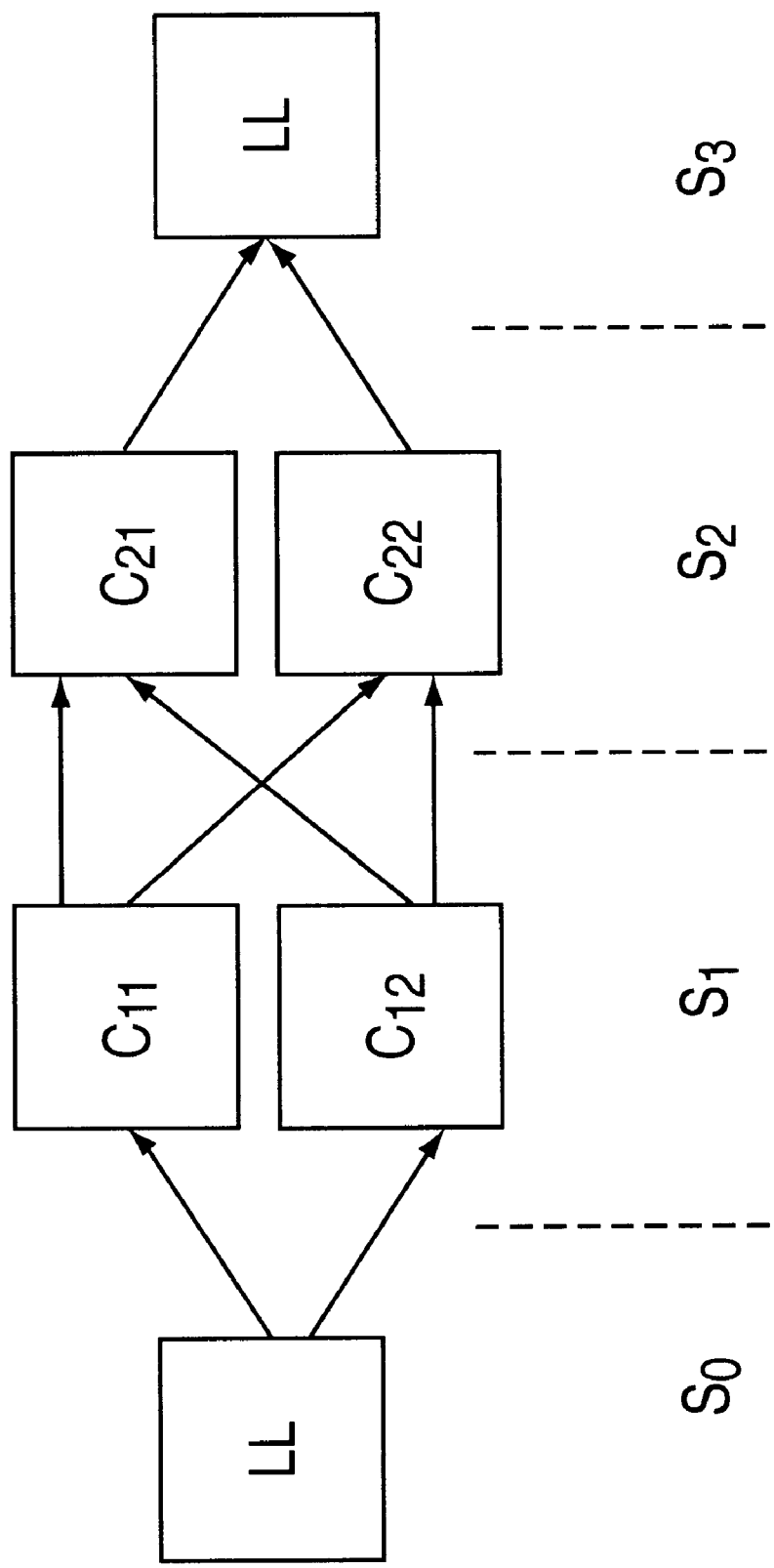
FIG. 13 depicts a flow diagram of a processing tool configuration that supports serial, parallel, and mixed traces.

In this configuration, k equals 2, $S_0$ and $S_3$ are the load locks LL, chambers $C_{11}$ and $C_{12}$ can fulfill sequence step $S_1$, and chambers $C_{21}$ and $C_{22}$ can fulfill sequence step $S_2$. This sequence is schematically depicted as a wafer flow diagram (also known as a wafer flow graph) in FIG. 13. As such, a number of traces can be used to fulfill the process sequence $S_0$ through $S_3$ such as:

$$LL \rightarrow C_{11} \rightarrow C_{21} \rightarrow LL$$

$$LL \rightarrow C_{11} \rightarrow C_{22} \rightarrow LL$$

$$LL \rightarrow C_{12} \rightarrow C_{21} \rightarrow LL$$

$$LL \rightarrow C_{12} \rightarrow C_{22} \rightarrow LL$$

This nomenclature shall be used in describing the various embodiments of the invention described below.

1. Priority-Based Scheduling for Dual Blade Robots—General Form

In certain situations, a DBR implementation of scheduling routines results in a significant decrease in the tool's throughput (relative to what is possible with a single blade robot). The reasons for such detrimental performance are two-fold.

The first reason results from poor implementation of an otherwise suitable scheduling routine. For example, after a wafer exchange, a DBR always ends up with a wafer on one of its blades. In poorly implemented scheduling, a DBR either continues working in a single blade mode using the empty blade while carrying a wafer on the other blade or the robot must put the wafer somewhere (other than the target chamber) in order to perform another wafer exchange using both arms. In either instance, there is a loss of throughput associated with a wafer exchange.

The second reason is due to a DBR generally being slower than a Single Blade Robot (SBR) such as the HP robot. If a DBR is operating such that throughput is robot bound (i.e., the robot is always busy and chambers may need to wait for the robot if processing in the chamber is completed before the robot can service the chamber), then the tool's throughput may be lower than when an SBR is used.

The goal of the present invention is to avoid having a DBR operate as an SBR while having a wafer on one of its blades. Thus, an efficient priority-based scheduling routine for DBR requires the following:

A) A DBR starts and ends the sequence of wafer exchanges with both blades empty.

B) The sequence of wafer exchanges starts with the highest priority chamber. As an alternate embodiment of the invention, the sequence of wafer exchanges can begin with the lowest priority and work toward the highest priority. The priority is based on a pre-specified index associated with each chamber or wafer that is defined by one or more of the following:

the length of chamber processing times;

chamber position in the processing sequence;

robot position relative to a chamber that has issued a call for service;

character of the throughput (process bound vs. robot bound);

minimizing the largest chamber waiting time;

oldest wafer in the cluster tool;

oldest wafer in the transfer space;

youngest wafer in the cluster tool;

youngest wafer in the transfer space;

wafer with most remaining process time in the chamber;

wafer with the least remaining process time in the chamber;

wafer with most remaining process time in the cluster tool;

wafer with the least remaining process time in the cluster tool;

wafer with most number of processing steps/stages completed;

wafer with the least number of processing steps completed;

wafer which has waited the longest; and wafer which has waited the least.

The robot may select a wafer for transfer as a consequence of choosing a particular chamber, based upon a chamber associated index. Likewise, the robot may choose a wafer based on a wafer associated priority index, and consequently, choose the chamber in which the wafer resides at that instant without regard for the chamber associated priority index.

C) A DBR performs consecutive wafer exchanges downstream (as described below) until the last wafer is placed into a load-lock or into a previously unoccupied chamber.

D) When all chambers/wafers in a stage have the same processing time or otherwise similar priority, the robot selects a chamber based upon a "tie-breaking rule." The tie-breaking rule can be any of the foregoing priority criteria.

Regardless of its length, a sequence of wafer exchanges by a DBR starts at the highest priority chamber (or a load-lock). The priority assigned to each chamber may change dynamically as the tool is used. As such, the indices are periodically updated during processing in response to particular activity in the tool.

Suppose the highest priority set of chamber is $C_{i1}$, $C_{i2}, \ldots, C_{ik}$. Since a DBR starts and ends the sequence of wafer exchanges with both blades empty, $C_{ik}$ must be either an empty chamber or a load-lock. Furthermore, if $C_{i1}$, $C_{i2}, \ldots, C_{ik-1}$ are respectively occupied by wafers $W_{i1}$, $W_{i2}, \ldots, W_{ik-1}$, then $C_{ij+1}$ must be a target chamber for the wafer $W_{ij}$ for $j=1,2,\ldots, k-1$. If $C_{i1}$ is not a load-lock, after the exchange, $C_{i1}$ will be empty and $C_{i2}, C_{i3}, \ldots, C_{ik}$ will respectively contain wafers $W_{i1}, W_{i2}, \ldots, W_{ik-1}$.

Figure 4:
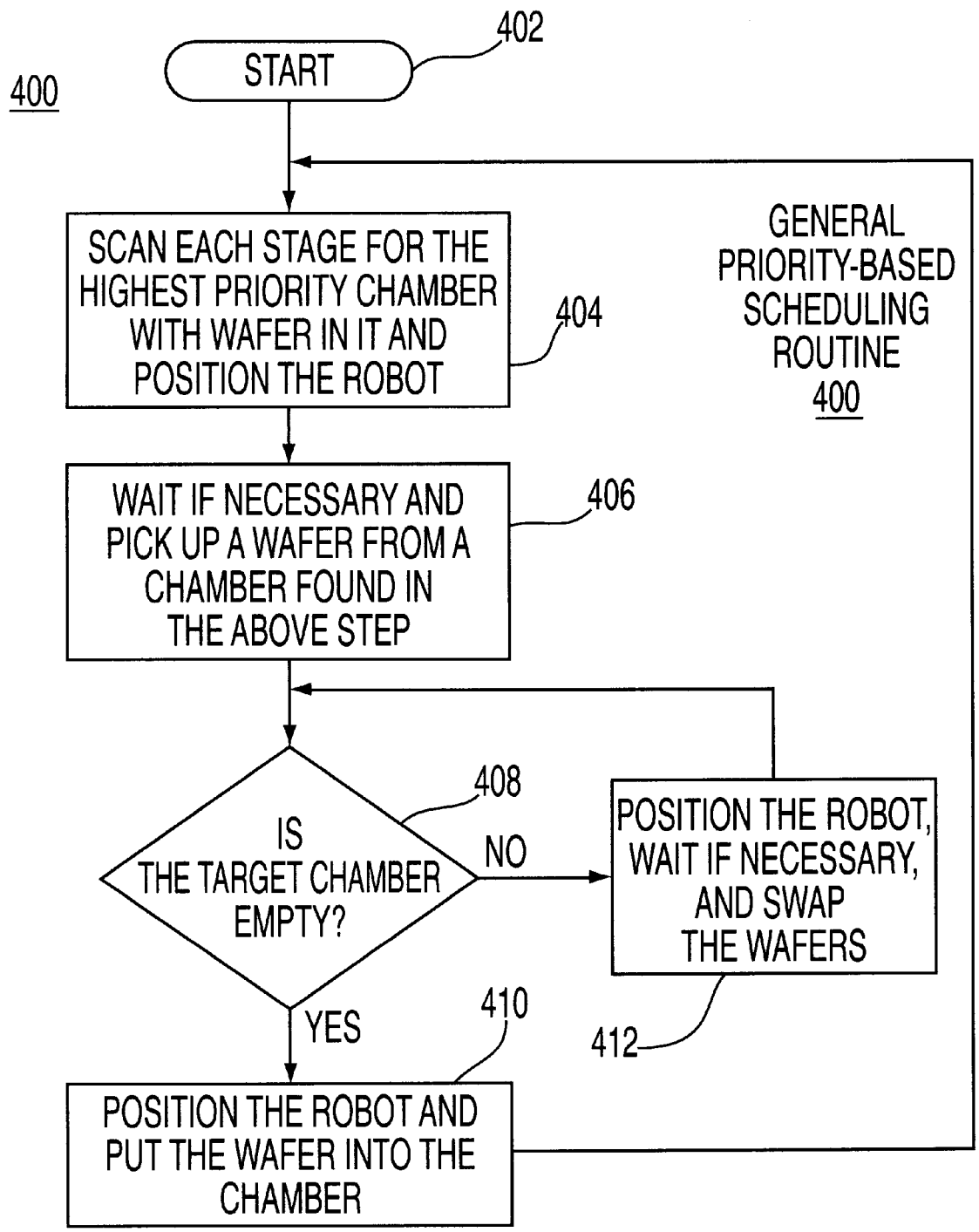
FIG. 4 depicts a flow diagram of a software implementation of a first embodiment of the present invention, a generalized form of a priority-based scheduling routine for controlling a dual blade robot.

FIG. 4 depicts a flow diagram of a general priority-based scheduling routine 400 for a DBR. The routine assumes that various traces have been defined for the tool and the chambers required to fulfill the traces are each assigned a priority index value. The routine begins at step 402 and proceeds to step 404 where the routine scans each stage of the wafer flow graph of the desired sequence to find a chamber which has the highest priority (e.g., the highest priority index value) and has a wafer in the chamber. In response to the highest priority chamber determination, the routine positions the robot (either blade) in front of the highest priority chamber and proceeds to step 406.

At step 406, the routine causes the robot to wait, if necessary, and retrieve a wafer from the chamber found in step 404. (At this point one blade is full and the other is empty.)

At step 408, the routine queries whether the target chamber for the wafer on the blade is empty. If the query is affirmatively answered, the routine proceeds to step 410; otherwise, the routine proceeds to step 412.

At step 410, the routine positions the full blade in front of the target chamber and places the wafer into the target chamber. At this point both blades are empty and the routine returns to step 404.

At step 412, the routine positions the empty blade in front of the target chamber. If necessary, the routine causes the robot to wait until the wafer in the target chamber is ready to be moved. The robot then swaps the wafer on the blade with the wafer in the target chamber. At this point, one blade is empty and another is full and the routine returns to step 408.

Determination of the highest priority chamber in step 404 depends on a priority index used to identify the level of priority for each chamber in the sequence. For example, if the priority index is defined by the chamber position in the processing sequence (i.e., facilitating a wafer packing routine), the starting position is always a load-lock. If the priority index is the aggregate stage processing time, the starting position is a chamber in the stage which has the largest aggregate processing time. In step 412, swapping the wafer on the blade with the wafer in the target chamber may involve, depending upon the type of robot, either rotation of the robot by $\phi$ degrees or a vertical movement of either a chamber robot or the dual-blade robot itself.

Note that the time needed to perform a sequence of consecutive wafer exchanges (until the target chamber is either empty or the target chamber is a load-lock) is comprised of a) time to preposition the blade at each chamber;

b) waiting time at each of the chambers;

c) time to swap the wafers on the robot blade with the wafer in the chamber. Additionally the transfer time clearly depends on how many times the loop comprising steps 408 and 412 in routine 100 is executed before the sequence is completed.

2. Simple Priority-Based Scheduling Technique—SWAP Routine

The second embodiment of the invention is a specific priority-based scheduling technique for use with any dual blade robot within a cluster tool. This technique is a specific embodiment of the generalized form discussed above. Using this technique, both blades of the robot are assumed to be empty upon entrance into the routine.

Figure 5:
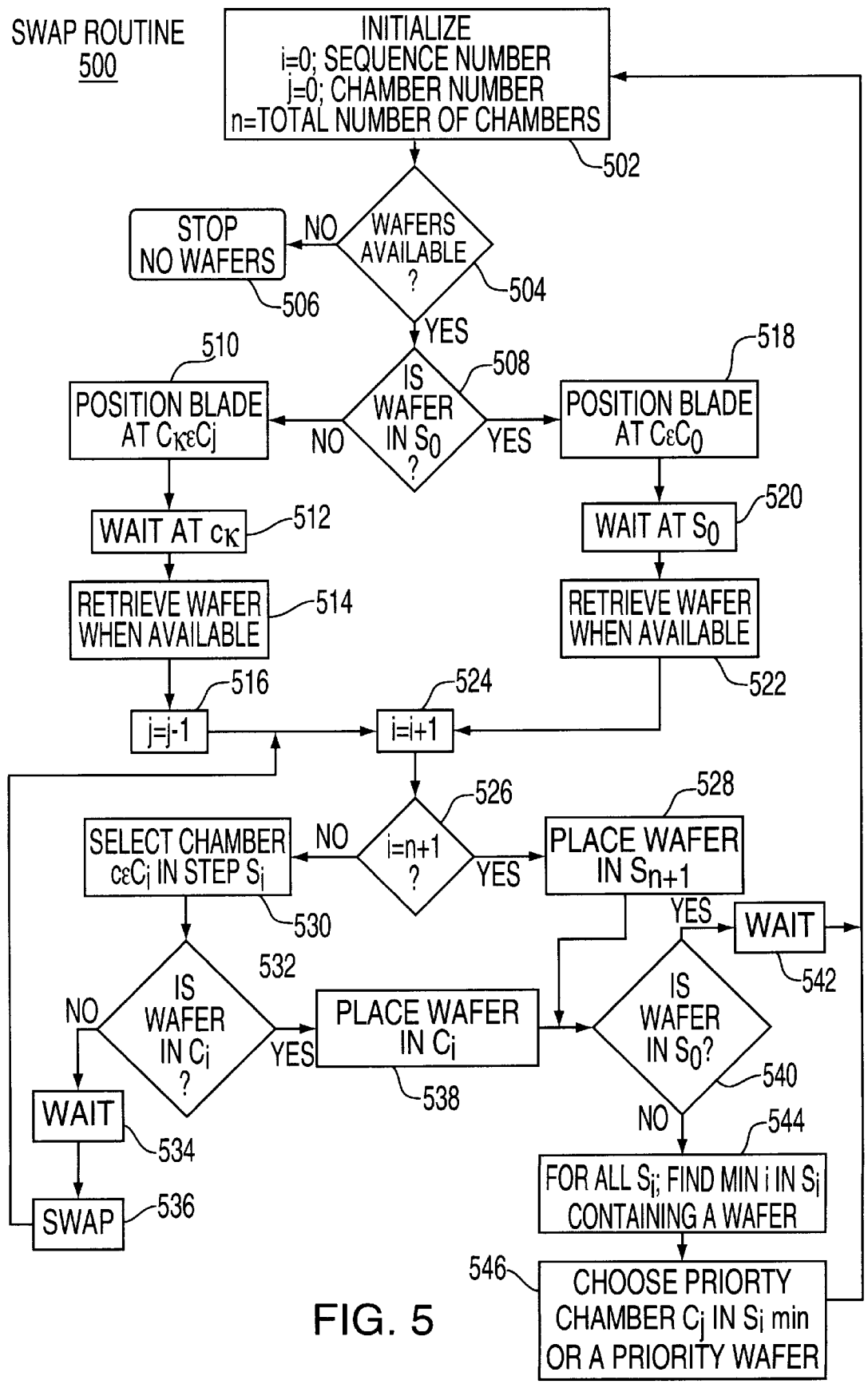
FIG. 5 depicts a flow diagram of a software implementation of a second embodiment of the invention, a SWAP routine.

FIG. 5 depicts a flow chart of a "swap" routine 500 of the first embodiment of the invention. The routine begins at step 502 wherein the variables i and j are initialized to 0 and the variable n is initialized to equal the total number of chambers in the tool. As previously discussed, the variable i represents the sequence number within the process sequence and the variable j represents the chamber number within each sequence step.

At step 504, the routine queries whether there is a wafer available within the chamber or the load lock for movement within the cluster tool. If the query is negatively answered, the routine stops at step 306 because there are no wafers within the cluster tool. Conversely, if there are wafers available in the cluster tool, the query at step 504 is affirmatively answered and the routine proceeds to step 508. At step 508, the routine queries whether there is a wafer within step "0" of the process sequence, i.e., a wafer is in the load lock awaiting positioning in a chamber within the first step of the sequence. If the query at step 508 is affirmatively answered, the robot blade is positioned at chamber $C_0$ (e.g., the load lock). At step 520, the robot waits for the wafer to be ready for movement from chamber 0. When the wafer is ready, at step 322, the robot retrieves the wafer and positions the wafer upon one of the robot blades.

Conversely, if at step 508 the query is negatively answered, the routine proceeds to step 510 wherein a robot blade is positioned at a chamber $C_k$ within the set of chambers $C_j$ (i.e., the chambers that are within a process step that are not the zero order process step). At step 512, the routine waits at chamber $C_k$ until the wafer in chamber $C_k$ is ready for removal. At step 314, the wafer is retrieved from the chamber when available. At step 516, the variable i is updated to equal j−1. And at step 524, the variable i is updated to equal i+1.

From step 524, the routine proceeds to step 526. At step 526, the routine queries whether i is equal to n+1 (e.g., the last chamber in the sequence of process steps). If the query of step 526 is affirmatively answered, the routine proceeds to step 528. At step 528, the wafer presently on the blade of the robot is placed in a chamber within step $S_{n+1}$ of the process sequence. The routine then returns from step 528 to step 540 to determine if the $S_{n+1}$ sequence step is the loadlock.

If the query at step 526 is negatively answered, the routine proceeds from step 526 to step 530. At step 530, the robot selects a chamber within the set of all chambers $C_i$ that are designated to complete the process step $S_i$. Once the robot is positioned at the chamber $C_i$, the routine queries at step 532 whether there is a wafer presently in chamber $C_i$. If the query at step 532 is answered affirmatively, the process proceeds to step 534 where the routine waits for the wafer presently in chamber $C_i$ to complete processing and then at step 536 it swaps the wafer on the blade of the robot with the wafer in the chamber $C_i$. Once the swap is complete between the two blades of the robot, the routine proceeds to step 524 where the sequence number is updated from i to i+1. Thereafter, the process continues to step 526.

If, at step 532, the query is negatively answered, the routine proceeds to step 538. At step 538, the wafer on the blade of the robot is placed into the chamber $C_i$. At step 540, the routine queries whether there is a wafer in chamber location $S_0$. If the query at step 540 is affirmatively answered, the routine proceeds to step 542 wherein the robot waits at a chamber within the chamber set that services process step $S_0$ (i.e., load lock) and awaits a wafer to be ready for removal. Thereafter, the routine proceeds from step 542 to step 502.

If the query at step 540 is negatively answered, the routine proceeds to step 544 wherein a wafer is to be moved from a process chamber within a process sequence step not equal to 0. To select a chamber to fulfill sequence steps; this embodiment of the invention uses a chamber prioritization technique. The routine, at step 544, first determines the minimum i value of the sequence steps $S_i$ that contains a wafer (i.e., $S_{i\ min}$). Then, at step 546, the routine determines a chamber that performs the minimum value process step having a high priority (i.e., the chamber that has been processing a wafer for the longest period of time) and moves the wafer from that chamber as soon as the wafer is available for movement. Specifically, at step 544, the routine 500 finds the minimum i within $S_i$ containing a wafer. Then, at step 546 the routine chooses a chamber $C_j$ containing a wafer in the process sequence step $S_{i\ min}$. When that wafer is removed from chamber $C_j$, the routine returns to step 502 and begins the SWAP routine again. The routine is repeated until there are no more wafers to be processed within the cluster tool.

Although this embodiment of the invention is described as prioritizing wafer movement based upon the chamber that has been processing a wafer for the longest period of time, other prioritization techniques may be used including finding the chamber with the longest or shortest overall processing time, the wafer having the greatest expense or remaining processing time on particular wafers within particular chambers, the order of the wafer entry into the tool, and the like.

To further illustrate the second embodiment of the invention, the following pseudo-code summarizes the SWAP routine 500 discussed above.

| | |
|---|---|
| 1. | Initialize i ← 0 in $S_i$ (i.e., $S_0$) |
| 1.1 | if wafers need to be processed then |
| 1.2 |   if wafer in $S_0$ then |
| 1.3 |     Position robot at chamber c ∈ $C_0$; |
| 1.4 |     Wait for wafer in $S_0$ and pick-up wafer from $S_0$ (i.e., chamber c ∈ $C_0$); |
| 1.5 |   else |
| 1.6 |     Position robot in chamber $C_k$ ∈ $C_j$ and pick-up wafer in chamber $C_k$; |
| 1.7 |     i ← j − 1; |
| 1.8 |   endif |

| | |
|---|---|
| 1.9 | else |
| 1.10 |   Go to (4); |
| 1.11 | endif |
| 2. | i ← i + 1; |
| 2.1 |   if i is n + 1 then |
| 2.2 |     Drop wafer in $S_{n+1}$; |
| 2.3 |     Go to (3.7); |
| 2.4 |   else |
| 2.5 |     Go to (3); |
| 2.6 |   endif |
| 3. | "Choose" chamber c ∈ $C_i$ then |
| 3.1 |   if wafer in chamber c ∈ $C_i$ |
| 3.2 |     Wait for wafer in chamber c ∈ $C_i$ to complete processing; |
| 3.3 |     Swap "wafer on blade" with "wafer in chamber;" |
| 3.4 |     Go to (2); |
| 3.5 |   else |
| 3.6 |     Drop "wafer on blade" in chamber c ∈ $C_i$; |
| 3.7 |     if wafer in $S_0$ then |
| 3.8 |       Wait for a wafer in $S_0$ (i.e., chamber c ∈ $C_0$); |
| 3.9 |     else |
| 3.10 |       for all $S_i$, i=1, ..., n; find minimum i (say j) with wafer in chamber; |
| 3.11 |       for all chambers c ∈ $C_j$; choose wafer (say k, i.e. wafer in chamber $c_j$); |
| 3.12 |       Wait for a wafer in chamber $c_k$ ∈ $C_j$; |
| 3.13 |     endif |
| 3.14 |     Go to (1); |
| 3.15 |   endif |
| 4. | STOP: no more wafers to process. |

Figure 6:
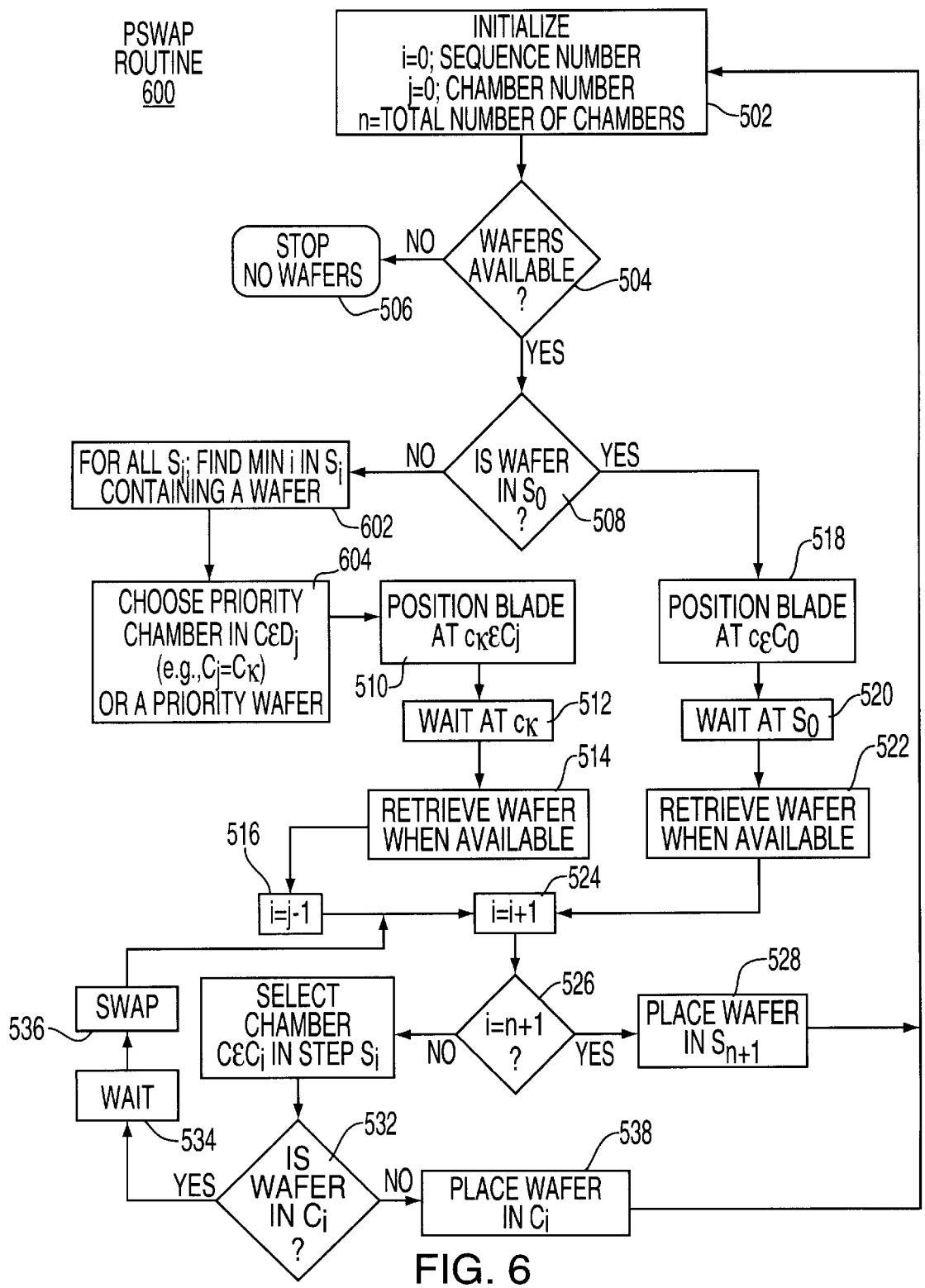
FIG. 6 depicts a flow diagram of a software implementation of a third embodiment of the invention, a PSWAP routine.

3. Improved Priority-Based Scheduling Technique that Prepositions the Robot—PSWAP Routine In routine 500 of FIG. 5, the robot remains in the position where it placed the last wafer, until another wafer requests, through a chamber call, to be moved. When the robot places a wafer into an empty chamber or into the load lock, the robot moves to retrieve a new wafer only after a new wafer arrives at sequence step $S_o$. Such waiting can impact the throughput of the cluster tool. An improvement upon the "SWAP" routine 500 is depicted in FIG. 6 as a "PSWAP" routine 600.

In routine 600, the robot anticipates which chamber will request the next movement. As such, the robot is moved to an appropriate chamber before the wafer may be ready for retrieval. The PSWAP routine 600 is very similar to the swap routine 500 and, as such, similar numbers have been used in both routines to describe similar process steps. However, a PSWAP routine 600 includes a priority-based selection sub-routine between steps 508 and 510 for selecting the next chamber from which a wafer will be retrieved. This routine is defined by steps 602 and 604. In step 602, for all process steps $S_i$ the routine finds the minimum i in which a wafer is being processed (i.e., $S_{i\ min=}$). Within the set of all chambers $C_j$ that perform the process step at $S_{i\ min}$, the routine finds, at step 604, the highest priority wafer in that set of chambers and positions, at step 510, the blade of the robot at that highest priority chamber. The priority of the chambers may be established using any of the previously described basis for priority.

One other additional variation from the swap routine 500 that is contained in the PSWAP routine 600 is that the step 538 directly proceeds from step 538 to step 502 once the wafer is placed in chamber $C_i$.

To further illustrate operation of the PSWAP routine, the following pseudo-code summarizes the PSWAP routine discussed above.

```
1.       Initialize i ← 0 in S_i (i.e., S_0)
1.1          if wafers need to be process then
1.2              if wafer in S_0 then
1.3                  position robot at chamber c ∈ C_0);
1.4                  wait for a wafer in S_0 then
                     pick-up wafer from S_0 (i.e.,
                     chamber c C_0);
1.5              else
1.6                  for all S_0 i=1, ..., n; find minimum i
                     (say j) with wafer in chamber;
1.7                  for all chambers c ∈ C_j, choose wafer
                     (say k, i.e., wafer in chamber c_k);
1.8                  position robot at chamber c_k ∈ C_j;
1.9                  Wait for a wafer in chamber C_k ∈ C_j then
                     pick up the wafer in chamber C_j;
1.10                 i'← j-1;
1.11             endif
1.12         else
1.13             Go to (4);
1.14         endif
2.       i ←– i+1;
2.1          if i is n + 1 then
2.2              Drop wafer in S_{n+1};
2.3              Go to (1);
2.4          else
2.5              Go to (3);
2.6          endif
3.       "Choose" chamber c ∈ C_i in sequence step S_j;
3.1          if wafer in chamber c ∈ Ci then
3.2              Wait for wafer in chamber c ∈ C_i to
                 complete processing;
3.3              Swap "wafer on blade" with "wafer
                 in chamber"
3.4              Go to (2);
3.5          else
3.6              Drop "wafer on blade" in chamber c ∈ C_j;
3.7              Go to (1);
3.8          endif
4.       STOP. no more wafers to process;
```

4. SWAP and PSWAP with an OUI Robot

The foregoing routines SWAP and PSWAP can be used to control an over-under independent (OUI) robot. The OUI robot contains two wafer transfer blades at distal ends of the independent transfer mechanisms. The two mechanisms have a common axis about which they rotate; however, the rotation of each transfer mechanism is completely independent. As such, the transfer mechanisms can independently and simultaneously service two different chambers. Note that, for example, one transfer mechanism can be controlled by the SWAP routine, while the other transfer mechanism can be controlled by the PSWAP routine. When the transfer mechanisms are operating independently, both mechanisms are precluded from servicing the same chamber simultaneously to avoid collisions.

5. γ-Tolerant Scheduling For Dual Blade Robots

Gamma(γ)-tolerant scheduling involves two types of decisions to perform wafer movement in the cluster tool. A 'primary' decision (e.g., service the highest priority chamber) and a 'meanwhile' decision (e.g., rather than waiting to service the highest priority chamber, do a useful wafer move elsewhere). A meanwhile move can be performed either according to the same or a different priority index than used previously.

Let $t_{lp}$ be the latest point in time a primary move (decision) could start. In other words, if the primary move starts after $t_{lp}$ the primary objective will be jeopardized. Let $t_{cur}$ be the current time and define the interval $$\Delta_{pr} := t_{lp} - t_{cur}. \tag{3}$$

If $\Delta_{pr} \leq 0$, the routine must perform the "primary" move (i.e., the routine is already late). Else if $\Delta_{pr} < 0$, there may be a chance to perform a "meanwhile" move before the robot needs to perform the primary move. Let $\Delta_{mw}$ represent the time needed for the meanwhile move (or moves, if there are several possibilities between two primary moves) and let $$\lambda = \frac{\Delta_{mw}}{\Delta_{pr}}. \tag{4}$$

Figure 7:
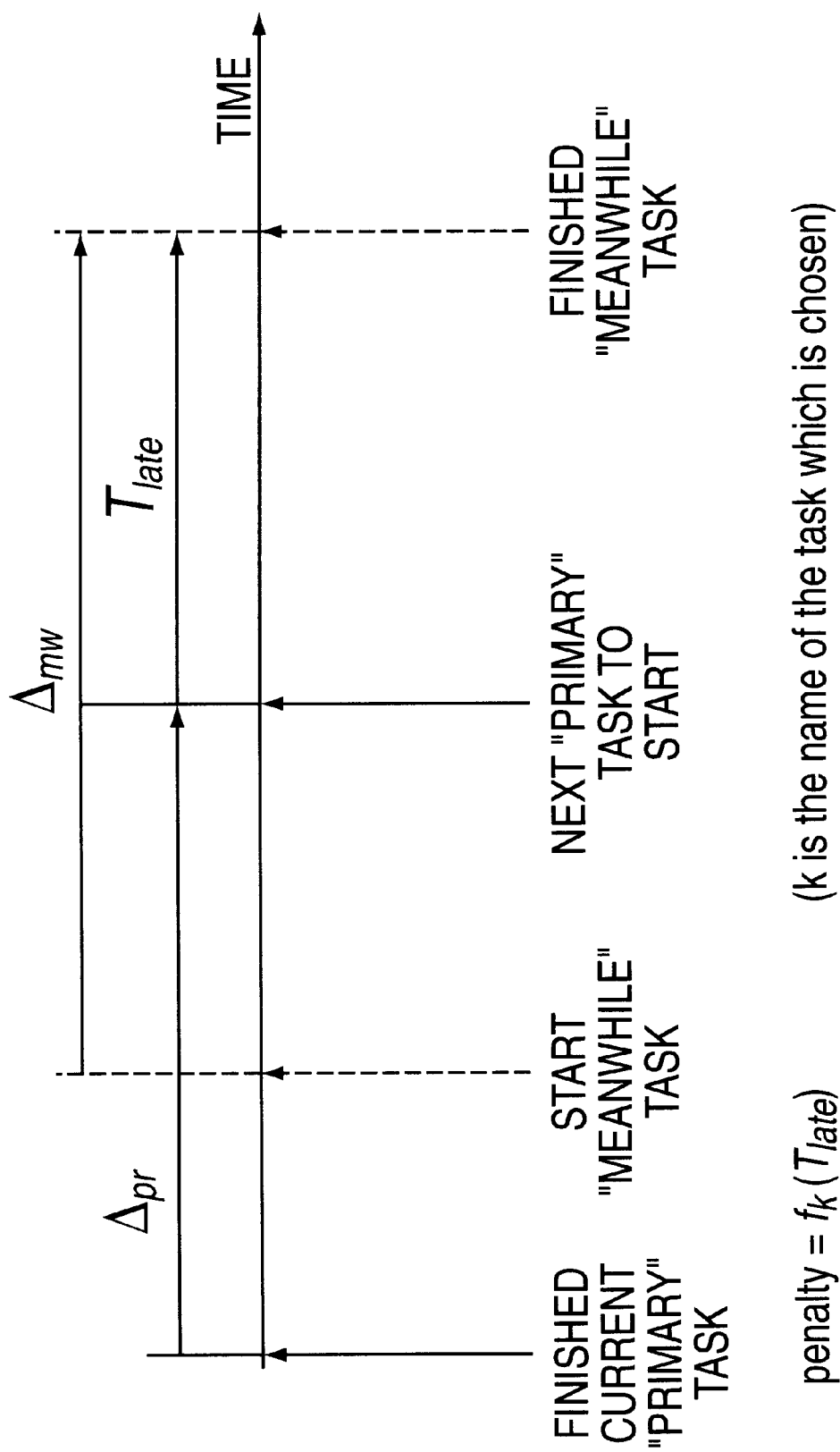
FIG. 7 depicts a timing diagram of a fourth embodiment of the invention, a γ-tolerant scheduling routine.

If $\lambda < \gamma$, perform the meanwhile move; else, wait if necessary and perform the primary move. A positive number γ is a system dependent threshold value. Clearly, if γ<1, the meanwhile move is made even if it means being late in executing the primary move. The system will tolerate (even welcome) being late for the primary move provided a useful move is made elsewhere. Hence the name γ-tolerant scheduling. A time diagram illustrating γ-tolerant scheduling is given in FIG. 7.

In almost all situations of practical interest, cause-effect relationships are difficult to describe precisely and thus it is not possible to determine γ without empirical study of a particular cluster tool configuration.

In multi-chamber tools, the value of γ should be first assessed by a simulation program and then fine-tuned on a real tool.

Figure 8:
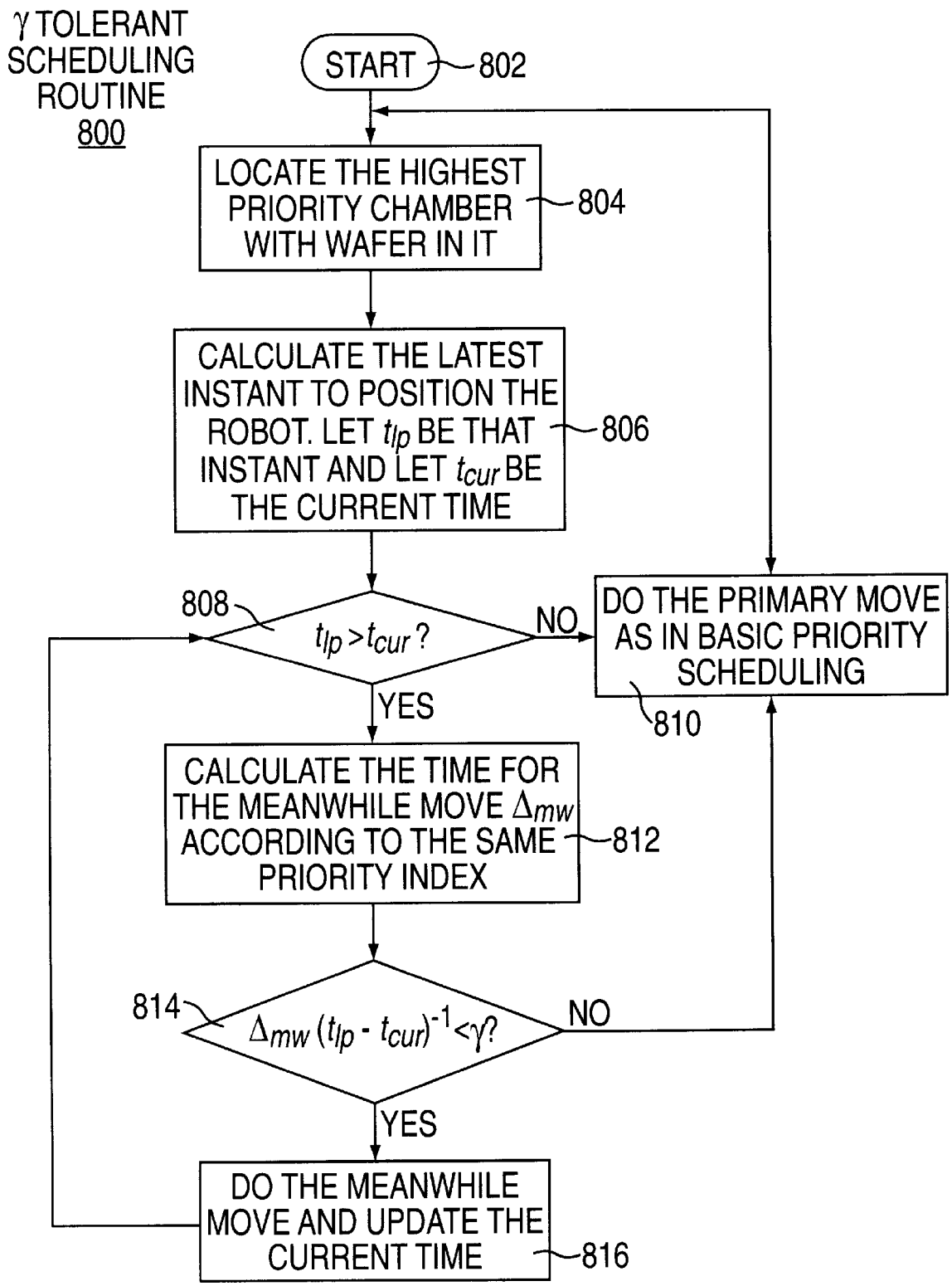
FIG. 8 depicts a flow diagram of a software implementation of a fourth embodiment of the invention, a γ-tolerant scheduling routine.

The following steps represent one implementation of a γ-tolerant scheduling routine. The following routine 800 is depicted as a flow diagram in FIG. 8.

Step 802 Start.

Step 804 Scan each stage to locate the highest priority chamber with wafer in it. Go to Step 806.

Step 806 Calculate the latest instant to position the robot in front of the highest priority chamber found in Step 804. Let $t_{lp}$ be that instant and let $t_{cur}$ be the current time. Go to Step 808.

Step 808 If $t_{lp} \leq t_{cur}$, go to Step 810. else ($t_{lp} \leq t_{cur}$) to Step 812.

Step 810 Perform the primary move as defined by the Basic Priority Scheduling of FIG. 4 (i.e., pick up a wafer from the highest priority chamber and perform consecutive wafer exchanges until both blades are empty). Go to Step 804.

Step 812 Calculate the time $\Delta_{mw}$ for the meanwhile move(s) according to the same priority index. Go to Step 814.

Step 814 If $(t_{lp} - t_{cur})^{-1} \Delta_{mw} < \gamma$, go to Step 816. Else, go to Step 810.

Step 816 Perform the meanwhile move(s). Update the current time $t_{cur}$ and go to Step 808.

Note that the meanwhile move here is again servicing a sequence of chambers according to rules of priority scheduling for dual blade robots.

The routine performs two calculations. First, in step 806, the routine calculates the latest instant to position the robot in front of the highest priority chamber (which is found in step 804). Note that this latest instant $t_{lp}$ depends not only on the state of the wafer in the highest priority chamber but also on the state of the wafer in its successor chamber, the successor of its successor and so on. Second, in step 812, the routine calculates the time $\Delta_{mw}$ needed for the meanwhile move. For dual blade robots, neither calculation is obvious and thus these computations are addressed next.

In order to calculate the time to perform a meanwhile move, the routine needs to know the instant of a chamber call for each of the chambers involved in the sequence of consecutive wafer exchanges (swaps) as well as robot movement times (extension, retraction and rotation time). Suppose $t_1, t_2, \ldots, t_n$ are the anticipated instants of the calls for chambers $C_1, C_2, \ldots, C_n$, respectively, where $C_i$ is serviced before $C_{i+1}$ regardless if $t_i < t_{i+1}$ or not. Let $r$, be the instant a robot arrives at Chamber C, ready to swap wafers. Then, for $i=2,3,\ldots, n$, $$\tau_{i+1} = max(t_i, \tau_i) + t_{swap} + r_{i,i+1} \qquad (5)$$

where $t_{swap}$ is the time needed to swap a wafer on the robot blade with the wafer in $C_i$ and $r_{i,i+1}$ is the time to move (rotate) the empty blade from $C_i$ to $C_{i+1}$. Note that $$\tau_1 = t_{cur} + r_{0,1} \qquad (6)$$

$$\tau_1 = t_{out} + r_{1,2} + max(t_1, \tau_1) \qquad (7)$$

where index 0 stands for the current position and $t_{out}$ is the time to remove a wafer from Chamber $C_1$ (initially both blades are empty). Since $C_{n+1}$ is either an empty chamber or a load-lock, then $$\Delta_{mw} = \tau_{n+1} + t_{in} + r_{n+1,p} - t_{cur} \qquad (8)$$

where $t_{in}$ is the time to put a wafer into $C_{n+1}$ and $r_{n+1,p}$ is the rotation time from position n+11 to the "highest priority position" determined in Step 804 of the routine.

As such the routine first calculates $\tau_1$, then by using $\tau_1$ and $t_1$ it calculates $\tau_2$, then by using $\tau_2$ and $t_2$ it calculates $\tau_3$ and so on until finally the routine calculates $\Delta_{mw}$ by using $\tau_{n+1}$. If throughput is robot bound, then $max(t_i, \tau_1) = \tau_1$ for all i. In that case there is a closed form solution for $\Delta_{mw}$, $$\Delta_{mw} = t_{in} + \sum_{i=0}^{n} r_{i,i+1} + nt_{swap} + r_{n+1,p} + t_{out} \qquad (9)$$

Since the number of chambers is small (say, less than ten), the recursion is short and thus the calculation is relatively fast.

To calculate the latest instant $t_{lp}$, let $C_1$ be the highest priority chamber in Step 804. In case of a single blade robot, the target chamber for a wafer in $C_1$ must be empty. In that case, $$t_{lp} = t_1 - r_{0,1} \qquad (10)$$

where $t_1$ is the chamber call instant of $C_1$ and $r_{0,1}$ is the robot rotation time from current position 0 to home position at $C_1$.

In case of a dual blade robot, a sequence of consecutive wafer exchanges usually involves two or more chambers. Suppose consecutive chambers are $C_1, C_2, \ldots, C_n$ with anticipated chamber call instants $t_1, t_2, \ldots, t_n$ where, as before, $C_i$ is serviced before $C_{i+1}$ regardless if $t_i < t_{i+1}$ or not. Clearly, calculating $t_{lp}$ as $t_1 - r_{0,1}$ does not make sense here if, for some i>1, the chamber call instant t, is much greater than $t_1$. In other words, servicing $C_1$ on time does not help much if the robot is to wait at $C_i$ for a long time.

Ideally, $t_{lp}$ should be chosen so that the robot waiting time at each chamber is zero and there is at least one chamber which does not wait for the robot. If robot starts with primary move at time $t_{cur}$, it will be reach $C_1$ at $$\tau_1 = t_{cur} + r_{0,1} \qquad (11)$$

and will be waiting for a wafer from $C_1$, $$\theta_1 = max(t_1, \tau_1) - \tau_1 \qquad (12)$$

seconds. It will be then at $C_2$ at an instant $$\tau_2 = t_{out} + r_{1,2} + max(t_1, \tau_1) \qquad (13)$$

and will be waiting for a wafer from $C_2$ $$\theta_2 = max(t_2, \tau_2) - \tau_2 \qquad (14)$$

seconds, and so on. Clearly, the instant $\tau_i$ of the robot arrival at $C_i$ for all i as well as the corresponding robot waiting times $\theta_i$, i=1, \ldots , n can be determined. Let $$\hat{\theta} = max\{\theta_i | i=1, \ldots, n\} \qquad (15)$$

The simplest estimate for the latest instant to position the robot at $C_1$ is $t_{lp} = t_{cur} + \hat{\theta}$.

5. Scheduling Routines for OUI Dual Blade Robots—Special Considerations

In OUI DBR, the blades operate independently as if there were two independent single blade robots position at a vertical distance z from one another. They are, however, coordinated through a scheduling routine similar to that previously discussed. With respect to the level of cooperation between blades, there are defined three modes of operation of an OUI DBR (in addition to the OUF mode):

a) Blades perform a wafer exchange in their respective dedicated regions. If these regions are overlapped, a limited coordination between blades in servicing common 'boundary' chambers is required (e.g., blade A services chambers $C_1$ and $C_2$, while blade B services chambers $C_2$ and $C_3$).

b) Any blade can service any chamber. In doing so, blades perform their respective wafer exchanges completely independently (as two single blade robots). For increased productivity, a limited cooperation between blades is required (so that they do not target the same chamber).

c) Blades fully cooperate in a wafer exchange. For example, one blade may be handling a source chamber (or a load-lock) while another is handling the target chamber (or a load-lock).

In (a) and (b) above, blades A and B act independently and coordination is required only to avoid simultaneously servicing the same chamber. Thus, a modification of scheduling heuristics for a single blade robot can be used. In this mode of operation, if blade A goes to service a chamber $C_x$, the target chamber for wafer in $C_x$ must be empty. Blade B may service some other chamber. Note that if blade B services the next target chamber on the general robot's list of tasks according to the same priority based logic as for blade A, the two blades would implement a form of γ-tolerant scheduling for a single blade robot. For a detailed description of a γ-tolerant scheduling technique for a SBR, see U.S. Pat. No. 5,928,389, and incorporated herein by reference.

In (a) above, the overlapping domains of service (chambers serviced by blade A and blade B) may be handled as:

The closest blade first (this is a poor scheduling rule for process bound throughput);

The largest remaining time to, for example, the next task first;

Decision based on the position of a common chamber in either wafer flow graph (i.e., wafer packing), Decision based on the direction of wafer's movement (if it goes into the service domain of A, use blade A), and so on. Clearly, to achieve the highest throughput, this decision must be based on a given wafer flow graph (since it is part of the overall scheduling logic).

It is the case (c) which offers additional possibilities in scheduling routine design and thus a potential for further improvement in throughput. Two fully cooperating single-blade robots can implement efficiently any scheduling routine for a general mixed wafer flow graph with processing loops. With proper software architecture of a sequencer, it should not be difficult to insert the modules which correspond to a robot functioning either as two single blade robots (competing or cooperating) or as a dual blade robot (for example, as a OUF robot).

Figure 9:
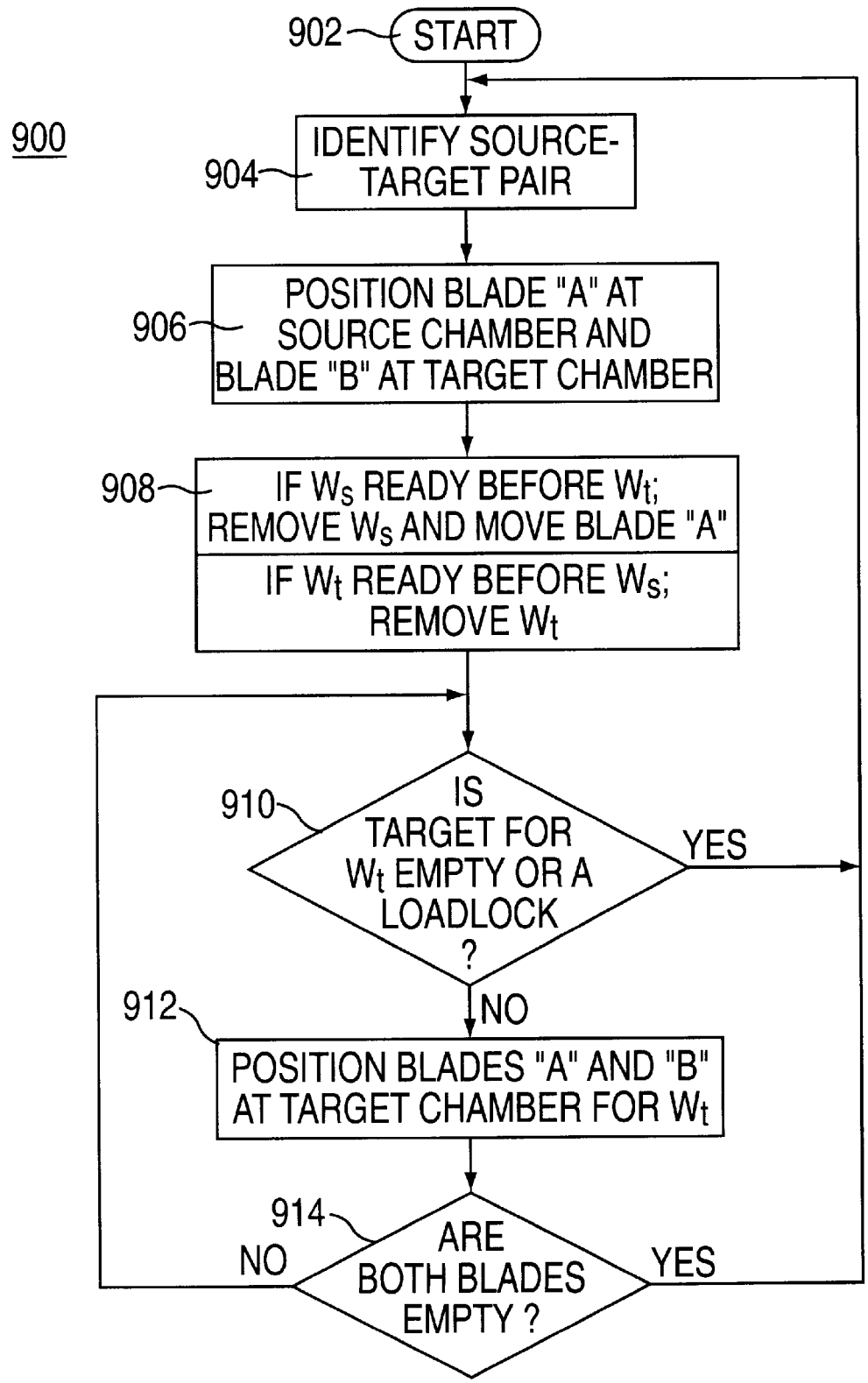
FIG. 9 depicts a flow diagram of a software implementation of a fifth embodiment of the invention for controlling an OUI robot.

FIG. 9 depicts a priority scheduling routine 900 for OUI robot operating in a cooperating mode.

Step 902. Start.

Step 904. Identify a source-target pair of chambers according to a pre-specified criterion (chamber processing time, chamber position in the WFG, etc.). Go to Step 906.

Step 906. Position blade A at the source chamber and blade B at the target chamber (or, vice versa, A at the target and B at the source). Let $w_s$ and $w_t$ be the wafers in source and target chamber, respectively. Go to Step 908.

Step 908. If $w_s$ is ready to leave before $w_t$, take out $w_s$ and start moving blade A toward the target chamber to do wafer exchange. If $w_t$ is ready to leave before $w_s$, take out $w_t$. (Blade A will bring in $w_s$ later.) In either case, after the exchange, there will be a wafer $w_t$ on blade B while blade A will be empty. Go to Step 4.

Step 910. If the new target chamber for $w_t$ is empty or it is a load-lock, leave $w_t$ there and go to Step 1.

Step 912. Else, position blades A (ready to remove target wafer) and B ($w_t$ is now on B) at the target chamber of $w_t$ and perform a wafer exchange. Go to Step 914.

Step 914. If both blades are empty, go to Step 904. Else, go to Step 910.

It seems that a general mixed trace is best served by two independent single blade robots. If it is desired to use the two blades as a dual-blade robot in OUF mode (for say a pure parallel or a pure serial trace), a software command locks the blades. If it is desired to use the robot as two independent single blade robots, scheduling routines from commonly assigned U.S. Pat. No. 5,928,389 are applicable to each of the blades. The implementation of these routines as well as of the above routine for cooperating mode of OUI is fairly simple.

6. A Specific Application of OUI Scheduling Routines—Liner Tool Scheduling

Figure 10:
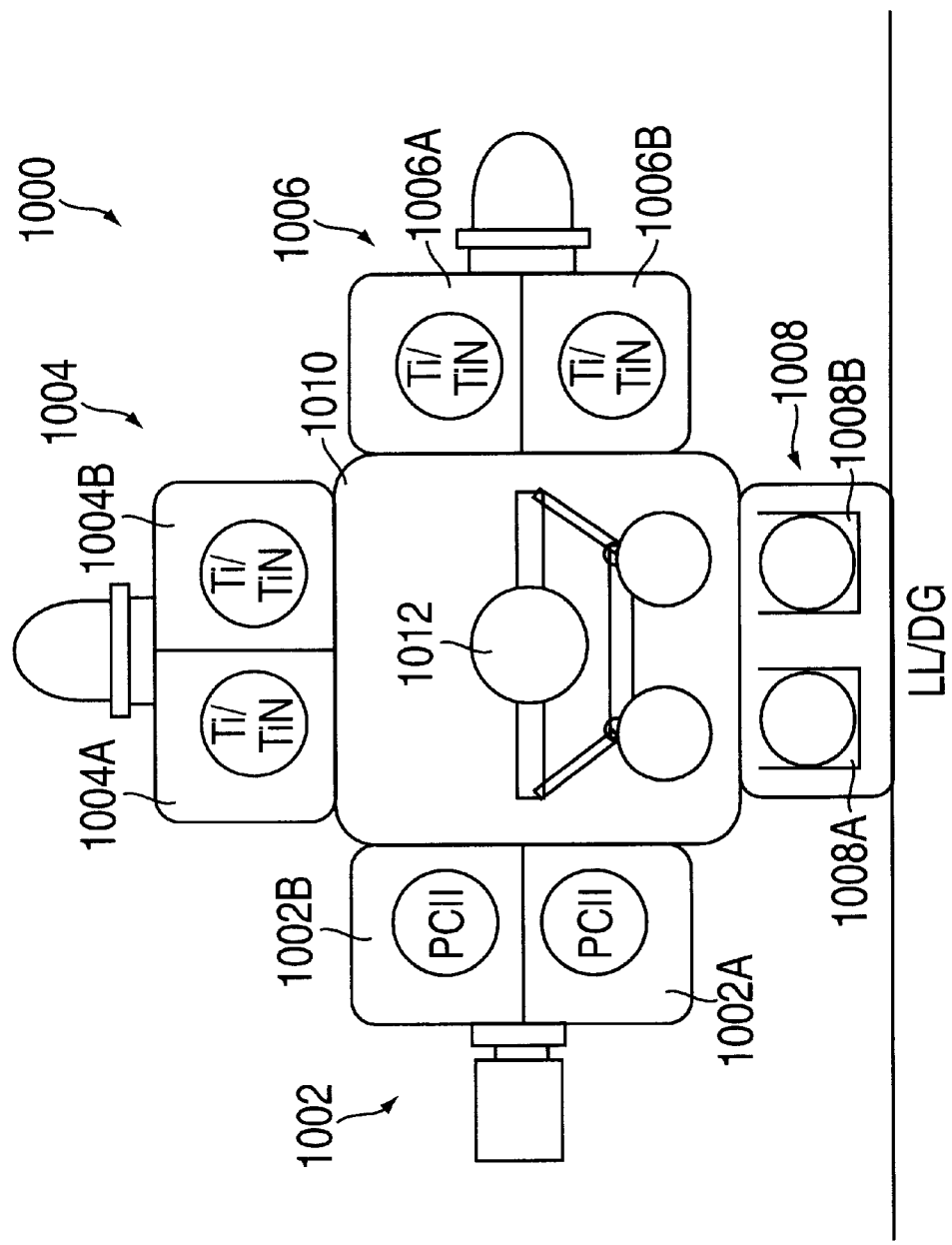
FIG. 10 depicts a schematic diagram of a liner tool having a OUF robot that operates in accordance with the present inventions.

The foregoing priority-based routines can be adopted to form two routines to maximize continuous throughput in a Liner Tool. The primary purpose of the liner tool is to perform a titanium/titanium-nitride (Ti/TiN) deposition. The configuration of the Liner Tool 1000 is shown in FIG. 10. The equipment consists of three processing chambers 1002, 1004, 1006 and, each processing chamber contains two sub-chambers 1002A and B, 1004A and B, and 1006A and B, respectively. Each subchamber has an identical processing capability of its counterpart subchamber. Additionally, all the subchambers are accessible through a central chamber 1010 that houses the transport mechanism 1012, e.g., a VHP robot having four blades. Scheduling for each of these robots is described below.

Each processing sub-chamber can accommodate a single wafer at a time. One processing chamber 1002 is dedicated for a preclean process, and the two other chambers 1004 and 1006 are dedicated to a Ti/TiN processing. Illustratively, the robot 1012 is an OUI robot having two parallel blades placed side-by-side, i.e., four blades all together. This robot services the processing chambers in accordance with an inventive scheduling routine. Specifically, the wafers are supplied to the system 1000 in wafer cassettes 1008A and 1008B that are positioned within a load lock 1008 and moved, as needed, from chamber to chamber using the robot.

All the wafers essentially go through the following sequence of chamber visitations: (1) a preclean step and (2) a Ti/TiN deposition step, before being returned to the loadlock. In addition, after each processed wafer is removed from a Ti/TiN chamber, the chamber undergoes a clean process to prepare the chamber for the next incoming wafer. After the processed wafer is removed from the Ti/TiN chamber, the cleaning is performed after positioning a mechanical shutter to cover the wafer support pedestal. The shutter protects the pedestal from damage that would result if the pedestal were exposed to the chemicals used to clean the chamber. Further, it is assumed that the orientation of the wafer is performed "on-the-fly", degassing of the wafer is performed in the loadlock, and the wafers are not cooled after processing. Since the wafers are not cooled after processing, the wafers are transferred into metal cassettes 1008A and 1008B.

The following assumptions are used in developing a priority-based scheduling routine for the liner tool: (1) each chamber 1002, 1004, and 1006 can accommodate two wafers at a time, one in each sub-chamber; (2) process times in the processing chambers are identical; (3) the processing times for each wafer is identical at the same processing step; (4) the robot speeds are identical for both the under and over robots; and (5) the robot serves both the sub-chambers of a chamber simultaneously. Note that the assumptions ignore events such as wafer breakage or partial robot breakdown and, the resulting, transfer of single wafers on a dual blade robot.

Preliminary studies revealed that maximum throughput can be obtained by dedicating each of the two robot mechanisms to the two Ti/TiN chambers: robot 1 ($r_1$) for Ti/TiN chamber 1 ($c_1$) and robot 2 ($r_2$) for Ti/TiN chamber 2 ($c_2$). Essentially, robot $r_1$ moves a wafer from the loadlock to the preclean chamber ($c_{pc}$) and, later, moves the precleaned wafer to chamber $c_1$. Note that for optimum performance robot $r_1$ retrieves (and, possibly, drop-off at the loadlock) the processed wafer from chamber $c_1$, while the wafer currently introduced into the preclean chamber is being processed. Similarly, robot $r_2$ serves chamber $c_2$. The schedule generated is sensitive to the various process and transfer times in the Liner Tool.

Essentially, the routine dedicates a robot (either the Over-Robot $r_1$ or the Under-Robot $r_2$) to serve a particular Ti/TiN chamber, and any particular wafer will be served by one, or the other, robot. Note that due to equal processing time in chambers $c_1$ and $c_2$ and identical preclean times on all the wafers in chamber $c_{pc}$, a little thought reveals that one robot (say $r_1$) and one chamber (say $c_1$) serves the odd-numbered wafers in the cassette. Similarly the even-numbered wafers are served by the other robot and chamber. In presenting the scheduling routines, it is arbitrarily assumed, without any loss of generality, robot $r_1$ and chamber $c_1$ serve the odd-numbered wafers, and robot $r_2$ and chamber $c_2$ serve the even-numbered wafers. In the following description a wafer is referred to as w, with the appropriate subscript as the wafer identifying number.

The scheduling routine that achieves maximum continuous throughput in the Liner Tool for the HP robot (i.e., single arm with two blades of FIGS. 15A and 15B), Task__Schedule__HP, is represented as pseudo-code below:

| | Task_Schedule_HP (wafer $w_i$ to $w_n$) |
|---|---|
| 1. | while unprocessed wafer $w_i$ (i=1 to n) is present in the loadlock |
| 2. | if wafer $w_i$ is an odd-numbered wafer then |
| 3. | robot $r_1$ drops-off $w_i$ to chamber $c_{pc}$ |
| 4. | while wafer $w_i$ is in chamber $c_{pc}$ |
| 5. | robot $r_2$ picks-up wafer $w_{i+1}$ from loadlock and waits for chamber $c_{pc}$ |
| 6. | robot $r_1$ picks-up wafer $w_{i+2}$ from chamber $c_1$ for processing |
| 7. | end while |
| 8. | robot $r_1$ picks-up wafer $w_i$ from chamber $c_{pc}$ and waits for chamber $c_1$ |
| 9. | robot $r_1$ drops-off wafer $w_i$ at chamber $c_1$ for processing |
| 10. | elseif wafer $w_i$ is even-numbered wafer then |
| 11. | robot $r_2$ drops-off $w_i$ to chamber $c_{pc}$ |
| 12. | while wafer $w_i$ is in chamber $c_{pc}$ |
| 13. | robot $r_1$ picks-up wafer wi+1 from loadlock and waits for chamber $c_{pc}$ |
| 14. | robot $r_2$ picks-up wafer $w_{i-2}$ from chamber $c_2$ and drops-off at loadlock |
| 15. | end while |
| 16. | robot $r_2$ picks-up wafer $w_i$ from chamber $c_{pc}$ and waits for chamber $c_2$ |
| 17. | robot $r_2$ drops-off wafer $w_i$ at chamber $c_2$ for processing |
| 18. | end if |
| 19. | end while |

The set of n wafers (wafer $w_1$ to $w_n$) in the cassette is passed on to the appropriate function mentioned above (after wafer mapping) for scheduling the activities in the Liner Tool.

Notice that in lines 8 and 16 of the Task_Schedule_HP routine while one robot begins to retrieve a completely processed wafer from the Ti/TiN chamber, the other robot needs to retrieve a new wafer from the loadlock. Also, lines 4–7 (and, lines 12–15) indicates that the robot with a wafer in the preclean chamber needs to drop-off a processed wafer from the appropriate Ti/TiN chamber.

Both of the above mentioned sequences are critical as it allows for each individual robot mechanism (arm) to interleave the different tasks in the Liner Tool. It should be noted, that if the preclean time is not sufficiently long to accommodate the time for a robot to pick-up and drop-off a processed wafer from a chamber to the loadlock, then it is necessary to use a VHP robot. The VHP robot uses the auxiliary-blade, for example, to hold a completely processed wafer $w_{i-2}$, while introducing wafer $w_i$, currently on the primary blade, into chamber $c_1$. Also, if the preclean chamber $c_{pc}$ cannot process two sets of wafers within the time required to process a single set of wafers in either of chambers $c_1$ or $c_2$, then it is clear that the preclean chamber is the bottle-neck chamber. In that case, it would be appropriate to keep the preclean chamber $c_{pc}$ constantly busy in order to obtain the maximum continuous throughput in the Liner Tool. Again, in this case, a VHP robot is used and the auxiliary-blade holds a completely processed wafer $w_{i-2}$, while introducing the unprocessed wafer $w_i$, currently on the primary blade, into chamber $c_{pc}$. Thus in both the cases, the auxiliary-blade of a VHP robot is used as a buffer position in the central chamber to hold a partially/completely processed wafer, while introducing another wafer into the appropriate chamber.

The scheduling routine for the VHP robot is represented by the following pseudo-code:

| | Task_Schedule_VHP (wafer $w_i$ to $w_n$) |
|---|---|
| 1. | while unprocessed wafer $w_i$ (i=1 to n) is present in the loadlock |
| 2. | if wafer $w_i$ is an odd-numbered wafer then |
| 3. | robot $r_1$ drops-off $w_i$ to chamber $p_{pc}$ |
| 4. | while wafer $w_i$ is in chamber $p_{pc}$ |
| 5. | robot $r_2$ picks-up wafer $w_{i+1}$ from loadlock; drops-off $w_{i-1}$; and waits for chamber $c_{pc}$ |
| 6. | robot $r_1$ picks-up and holds wafer $w_{i-2}$ from chamber $c_1$ using the auxiliary blade |
| 7. | end while |
| 8. | robot $r_1$ picks-up wafer $w_i$ from chamber $c_{pc}$ and waits for chamber $c_1$ |
| 9. | robot $r_1$ drops-off wafer $w_i$ at chamber $c_1$ for processing |
| 10. | elseif wafer $w_i$ is even-numbered wafer then |
| 11. | robot $r_2$ drops-off $w_i$ to chamber $c_{pc}$ |
| 12. | while wafer $w_i$ is in chamber $c_{pc}$ |
| 13. | robot $r_1$ picks-up wafer $w_{i+1}$ from loadlock; drops-off wafer wi–1; and waits for chamber $c_{pc}$ |
| 14. | robot $r_2$ picks-up and holds wafer $w_{i-2}$ from chamber $c_2$ using the auxiliary blade |
| 15. | end while |
| 16. | robot $r_2$ picks-up wafer $w_i$ from chamber $c_{pc}$ and waits for chamber $c_2$ |
| 17. | robot $r_2$ drops-off wafer $w_i$ at chamber $c_2$ for processing |
| 18. | end if |
| 19. | end while |

The distinction between the two routines is shown in lines 4–7 (and, lines 12–17), accounting for the discussion above.

Given that each wafer goes through a preclean process before any deposition and, furthermore, there are two Ti/TiN processing chambers, the system requires two sets of wafers to be processed through the preclean chamber before a single set of wafers are processed through any Ti/TiN chamber. Thus in the schedule, it is incumbent that two preclean steps ($t_{pc}$) need to be accomplished within the time required to perform a complete Ti/TiN process ($t_p + t_{po}$) and a clean operation ($t_c + t_{co}$) on a single wafer in any one of the Ti/TiN chambers. Including time for transferring wafers between chamber we have the following condition.

$$t_0 + t_p + t_c + 2t_e \geq 2t_{pc} + 2t_r + 4t_e \quad (16)$$

where:

| | |
|---|---|
| Robot rotation time 180° (empty/loaded) | $t_r$ |
| Robot extension time (empty/loaded) | $t_e$ |
| Wafer transfer time (from blade to lift/from lift to blade) | $t_2$ |
| Robot retraction time (empty/loaded) | $t_r$ |
| Process time | $t_p$ |
| Process overhead time | $t_{po}$ |
| Clean time | $t_c$ |
| Clean overhead time | $t_{co}$ |
| Total (process & clean) overhead time | $t_o$ (= $t_{po} + t_{co}$) |
| Preclean time | $t_{pc}$ |

Similarly, to accomplish the maximum continuous throughput with HP robots it is necessary that the preclean time be sufficiently large to allow the robot time to drop-off a finished wafer into the loadlock. Thus, after a new wafer is introduced into the preclean chamber, the robot should have sufficient time to pick-up a processed wafer from the appropriate Ti/TiN chamber ($t_e$), drop-off the finished wafer into the loadlock ($t_c$), and be in position to retrieve the precleaned wafer. This gives us the following expression.

$$t_{pc} \geq 3t_p + 2t_e \tag{17}$$

Note that the clean process ($t_c + t_{co}$) at the end of the Ti/TiN process should be at least long enough to accommodate the robot to perform different tasks before the newly precleaned wafer can be introduced at the appropriate Ti/TiN chamber. Therefore, consequent to dropping-off of a wafer into the preclean chamber the robot requires sufficient time to: (1) rotate and pick-up a processed wafer from an appropriate Ti/TiN chamber, (2) drop-off the processed wafer at loadlock, and (3) pick-up the precleaned wafer and preposition at the appropriate Ti/TiN chamber.

$$t_c + t_{co} \geq 3t_r + 2t_e \tag{18}$$

Furthermore, the clean process should be sufficiently short so that the finished wafer can be removed from a Ti/TiN chamber while the preclean is underway. This is given by the following condition. In this equation, time $t_h$ denotes the time it is feasible to hold a wafer on a blade while waiting for the appropriate Ti/TiN processing chamber without violating condition (1). Note that $t_h > 0$ if the right-hand-side is larger than the left-hand-side in Equation (18).

$$t_c + t_{co} \geq t_{pc} + t_h + t_r + t_e \tag{19}$$

Given that the above conditions are met, the routine guarantees that it is sufficient to use a Over-Under HP robot configuration to obtain maximum continuous throughput. Once these conditions are satisfied during the processing of one wafer in the Ti/TiN chamber, the routine guarantees repeatability until all the wafers in the cassette are completed.

Figure 11:
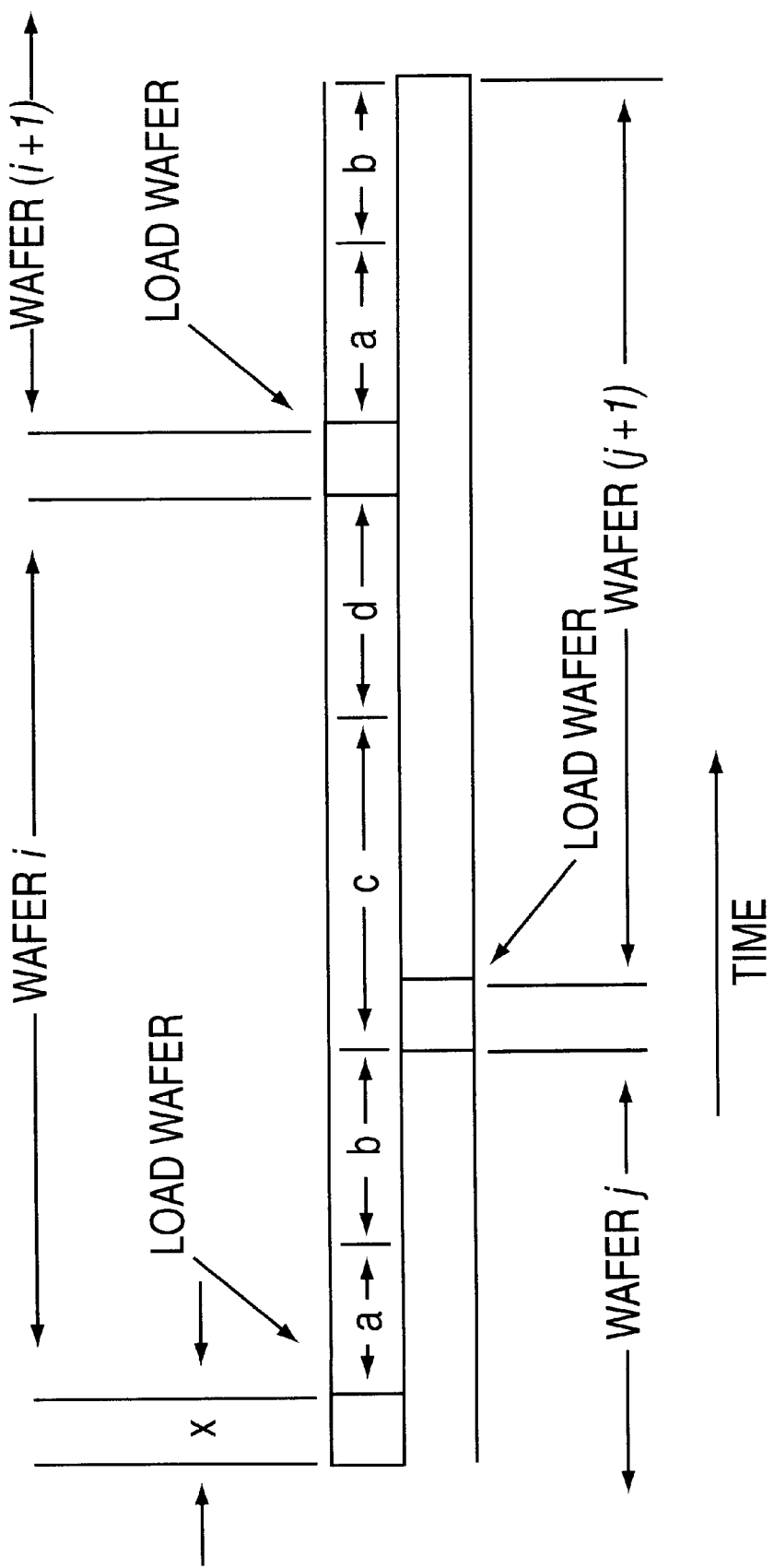
FIG. 11 depicts a geometrical representing of wafer movement between two chambers of the liner tool of FIG. 9.

The proof is geometrically represented in FIG. 11. In this figure, wafer $w_i$ and wafer $w_{i+1}$ are processed in chamber $c_1$, while wafer $w_j$ and wafer $w_{j+1}$ are processed in chamber $c_2$. Suppose that a is the point when the wafer $w_j$ is finished processing in chamber $c_2$, and (a+b+c) is the point when the wafer $w_i$ finishes processing in chamber $c_1$. Since, the processing times are the same for all wafers in chambers $c_1$ and $c_2$ and the transfer times are identical for both robots $r_1$ and $r_2$, geometrically the wafer $w_{j+1}$ is (a+b) time-offset from the start of processing of wafer $w_{i+1}$ (just as wafer $w_j$ is (a+b) time-offset from the start of processing of wafer $w_i$). Thus, if time (a+b+x) and (c+d) is sufficient to accommodate the precleans for wafers $w_{i+1}$ and $w_{j+1}$, by geometry it is guaranteed that precleans on wafers $w_{i+2}$ and $w_{j+2}$ can be performed during the processing of wafer $w_{i+1}$. This completes the proof of validity of the above algorithm.

In case the conditions in Equations (1)–(4) are satisfied, then the continuous throughput for the Liner Tool can be calculated as follows:

$$\text{Continuous Throughput} = [3600]/t_o + t_p + t_c + 2t_e)/4 \tag{20}$$

Next, in case if any of the above conditions are violated, the scheduling routine still achieves maximum performance by using a VHP robot $r_1$ and $r_2$. Here, the auxiliary-blade is used in the central chamber as buffer for the completely processed wafer. This eliminates the time required to drop-off a fully processed wafer into the loadlock and, hence, can accommodate shorter preclean and Ti/TiN chamber clean times. In this scenario, the processed wafer is dropped by a robot ($r_1$) at the loadlock and, at the same time, a new wafer is retrieved by the same robot ($r_1$) to be processed in the preclean chamber.

In case condition (1) is violated and, consequently, the preclean chamber cannot process two sets of wafers in time, a single set of wafers are processed on any Ti/TiN chamber, then the preclean is the bottle-neck. Here, the priority in the schedule is given to keep the preclean chamber constantly busy. Also, as mentioned earlier, a VHP robot may be required to keep the preclean chamber busy, where the auxiliary blade can be used to hold a completely processed wafer from the appropriate Ti/TiN chamber. Here, the time required to process two sets of wafers on the preclean chamber is sufficient to process one set of wafers on any of the Ti/TiN chambers. Note, however, we assume that the total Ti/TiN chamber operation time ($t_o + t_p + t_c$) is at least as much as the preclean times ($t_{pc}$)—which is more than likely to occur in the Liner Tool, based on the reality of common Ti/TiN deposition process technology. Based on the above discussion, the following conditions apply:

$$t_o + t_p + t_c + 2t_e < 2t_{pc} + 4t_e \tag{21}$$

$$t_o + t_p + t_c + 2t_e > 2t_{pc} + 2t_e \tag{22}$$

In this case, the continuous throughput for the Liner Tool is given by the following expression.

$$\text{Continuous Throughput} = [3600]/(2t_{pc} + 4t_e)/4 \tag{23}$$

An example schedule that is generated using the conditions presented above provides the times presented below. The times are based on typical times used in a Ti/TiN process under current process technology. Note that with the given times it is sufficient to use an Over-Under HP robot configuration.

|  | Time (sec.) |
|---|---|
| Robot rotation time 180° (empty/loaded) | 3.0 |
| Robot extension time (empty/loaded) | 2.0 |
| Wafer transfer time (from blade to lift/from lift to blade) | 2.0 |
| Robot retraction time (empty/loaded) | 2.0 |
| Process time | 65.0 |
| Process overhead time | 25.0 |
| Clean time | 15.0 |
| Clean overhead time | 65.0 |
| Total (process and clean) overhead time | 40.0 |
| Preclean time | 40.0 |

Figure 12:
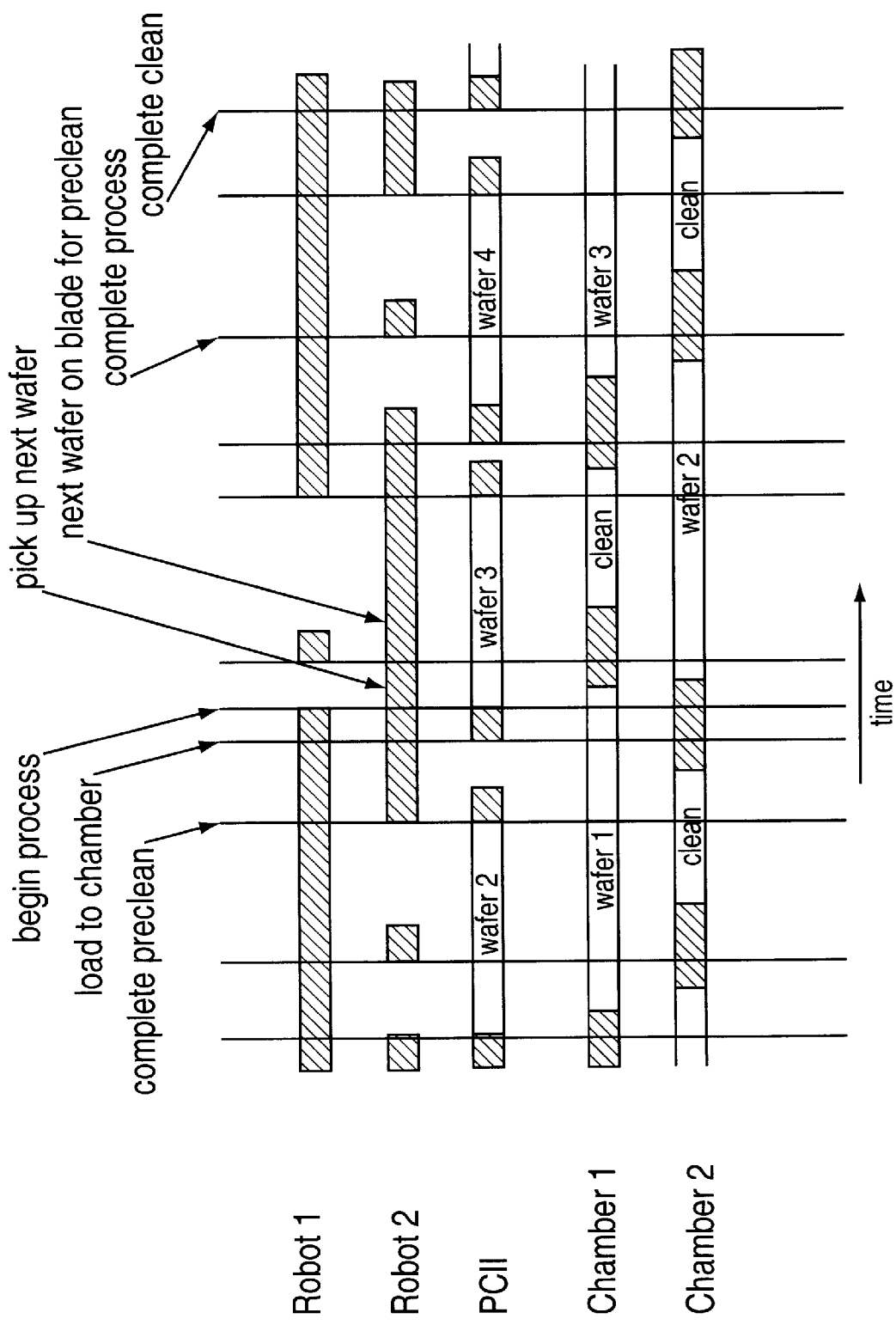
FIG. 12 depicts a snap-shot of a priority based schedule for the liner tool of FIG. 10.

The example schedule is generated using the Task_Schedule_HP routine. FIG. 12 depicts a snap-shot of the schedule generated from the routine. In this figure, note that both the robots drop-off the wafer into the loadlock while another wafer (it is serving) is currently being processed in the preclean chamber. Also, note that as one robot turns to drop-off a processed wafer from the Ti/TiN chamber, the other robot retrieves a new wafer from the loadlock. As mentioned before, this interleaving of robot task is possible due to the independence of the two robots. Here, the continuous throughput is calculated using Equation (20). For the above example system parameters the continuous throughput generated by the Task_Schedule_HP routine is 101 wafers per hour.

Although various embodiments which incorporate the teachings of the present invention have been shown and described in detail herein, those skilled in the art can readily devise many other varied embodiments that still incorporate these teachings.

What is claimed is:

1. A method for scheduling a plurality of semiconductor wafers for processing within a multiple chamber, semiconductor wafer processing system having a plurality of chambers that are serviced by at least one multiple blade wafer transfer mechanism, said method comprising:

assigning a priority to each chamber, each wafer, or both in said plurality of chambers;

selecting a chamber having a highest priority or selecting a chamber containing a wafer having a highest priority; and moving a wafer from a selected chamber to a target chamber in accordance with the assigned priority of the selected chamber or wafer.

2. The method of claim 1 wherein, if a plurality of chambers have the highest priority, the selecting step further comprises the step of selecting a chamber having a highest priority and having a shortest remaining process time.

3. The method of claim 1 wherein said multiple blade wafer transfer mechanism supports at least two wafers during moving step.

4. The method of claim 1 further comprising the steps of:

determining a time to complete ($T_{remains}$) processing for the selected chamber;

computing a time to perform ($T_{meanwhile}$) a wafer move for at least one other chamber;

dividing $T_{meanwhile}$ by $T_{remains}$ to produce a quotient;

comparing the quotient to a threshold value;

if the quotient is less than the threshold value, then move the wafer in the selected chamber; and if the quotient is greater than the threshold value, then move a wafer in the other chamber.

5. The method of claim 1 further comprising the step of dynamically assigning priority to each chamber or wafer.

6. The method of claim 1 wherein, if a wafer in said selected chamber is not completely processed, said transfer mechanism waits for said wafer to be completely processed.

7. The method of claim 1 further comprising the step of prepositioning a blade of said multiple blade wafer transport mechanism proximate an entrance to said selected chamber.

8. The method of claim 1, where said selected chamber is a pair of chambers and wherein said at least one multiple blade robot is a dual blade robot having a pair of blades that access a pair of chambers simultaneously.

9. The method of claim 1 wherein said at least one multiple blade robot comprises independently moveable blades.

10. The method of claim 1 wherein said at least one multiple blade robot comprises a pair of blades that move in unison.

11. The method of claim 1 further comprising the steps of:

anticipating which of the chambers next requires a wafer to be removed as an anticipated chamber; and pre-positioning a robot blade proximate said anticipated chamber.

12. The method of claim 11 further comprising the step of:

using the prepositioned robot blade to perform another wafer movement if said anticipated chamber is not a chamber requiring a next wafer movement.

13. A computer readable medium for storing computer readable code that, when executed by a computer, causes the computer to control a semiconductor wafer processing system to perform a method comprising the steps of:

assigning a priority to each chamber within a cluster tool having a plurality of chambers, each wafer, or both in said plurality of chambers;

selecting a chamber having a highest priority or selecting a chamber containing a wafer having a highest priority; and moving a wafer from a selected chamber to a target chamber in accordance with the assigned priority of the selected chamber or wafer.

14. The method of claim 13 wherein, if a plurality of chambers have the highest priority, the selecting step further comprises the step of selecting a chamber having a highest priority and having a shortest remaining process time.

15. The method of claim 13 wherein a multiple blade wafer transfer mechanism supports at least two wafers during moving step.

16. The method of claim 13 further comprising the steps of:

determining a time to complete ($T_{remains}$) processing for the selected chamber;

computing a time to perform ($T_{meanwhile}$) a wafer move for at least one other chamber;

dividing $T_{meanwhile}$ by $T_{remains}$ to produce a quotient;

comparing the quotient to a threshold value;

if the quotient is less than the threshold value, then move the wafer in the selected chamber; and if the quotient is greater than the threshold value, then move a wafer in the other chamber.

17. The method of claim 13 further comprising the step of dynamically assigning priority to each chamber, wafer or both.

18. The method of claim 13 wherein, if a wafer in said selected chamber is not completely processed, said transfer mechanism waits for said wafer to be completely processed.

19. The method of claim 13 wherein said moving step further comprises the step of pre-positioning a blade of a multiple blade wafer transport mechanism proximate an entrance to said selected chamber.

20. The method of claim 13, where said selected chamber is a pair of chambers and wherein said at least one multiple blade robot is a dual blade robot having a pair of blades that access a pair of chambers simultaneously.

21. The method of claim 13 further comprising the steps of:

anticipating which of the chambers next requires a wafer to be removed as an anticipated chamber; and pre-positioning a robot blade proximate said anticipated chamber.

22. The method of claim 21 further comprising the step of:

using the prepositioned robot blade to perform another wafer movement if said anticipated chamber is not a chamber requiring a next wafer movement.

* * * * *